United States Patent [19]
Dershem et al.

[11] Patent Number: 6,121,358
[45] Date of Patent: Sep. 19, 2000

[54] HYDROPHOBIC VINYL MONOMERS, FORMULATIONS CONTAINING SAME, AND USES THEREFOR

[75] Inventors: Stephen M. Dershem; Jose A. Osuna, Jr., both of San Diego, Calif.

[73] Assignee: The Dexter Corporation, Windsor Lock, Conn.

[21] Appl. No.: 08/935,352

[22] Filed: Sep. 22, 1997

[51] Int. Cl.⁷ .................................................. C08K 3/08
[52] U.S. Cl. ........................ 524/439; 252/513; 252/514; 524/440; 524/441
[58] Field of Search ................................. 252/513, 514; 524/439, 440, 441

[56] References Cited

U.S. PATENT DOCUMENTS

| | | | |
|---|---|---|---|
| 3,808,028 | 4/1974 | Lando | 117/47 |
| 4,110,364 | 8/1978 | Gaku et al. | 528/170 |
| 4,188,276 | 2/1980 | Lyons | 524/530 |
| 4,369,302 | 1/1983 | Ikeguchi et al. | 528/73 |
| 4,534,888 | 8/1985 | Cobbledick | 252/511 |
| 4,552,690 | 11/1985 | Ikeguchi et al. | 252/512 |
| 4,604,452 | 8/1986 | Shimp | 528/422 |
| 4,608,434 | 8/1986 | Shimp | 528/422 |
| 4,627,151 | 12/1986 | Mulholland et al. | 29/569 |
| 4,642,321 | 2/1987 | Schoenber et al. | 523/400 |
| 4,700,473 | 10/1987 | Freyman et al. | 29/846 |
| 4,709,008 | 11/1987 | Shimp | 528/422 |
| 4,713,403 | 12/1987 | Yoshida | 534/440 |
| 4,740,343 | 4/1988 | Gaku et al. | 264/225 |
| 4,740,584 | 4/1988 | Shimp | 528/422 |
| 4,785,075 | 11/1988 | Shimp | 528/422 |
| 4,839,442 | 6/1989 | Graig, Jr. | 528/422 |
| 4,847,233 | 7/1989 | Shimp | 502/171 |
| 4,855,002 | 8/1989 | Dunn | 524/441 |
| 4,914,814 | 4/1990 | Behun et al. | 29/843 |
| 4,946,928 | 8/1990 | Jackson et al. | 528/205 |
| 4,999,136 | 3/1991 | Su | 252/512 |
| 4,999,699 | 3/1991 | Christie et al. | 357/65 |
| 5,006,673 | 4/1991 | Freyman et al. | 174/255 |
| 5,011,066 | 4/1991 | Thompson | 228/180.2 |
| 5,030,308 | 7/1991 | Sheyon et al. | 156/235 |
| 5,036,128 | 7/1991 | Durand | 524/440 |
| 5,150,195 | 9/1992 | Nguyen | 357/72 |
| 5,155,066 | 10/1992 | Nguyen | 437/209 |
| 5,173,766 | 12/1992 | Long et al. | 257/687 |
| 5,186,383 | 2/1993 | Melton et al. | 228/180.2 |
| 5,189,077 | 2/1993 | Kerby | 524/439 |
| 5,216,278 | 6/1993 | Lin et al. | 257/688 |
| 5,252,355 | 10/1993 | Ando et al. | 427/98 |
| 5,306,739 | 4/1994 | Lucey | 524/439 |
| 5,358,992 | 10/1994 | Dershem et al. | 524/439 |
| 5,395,876 | 3/1995 | Frentzel | 524/440 |
| 5,446,118 | 8/1995 | Shen et al. | 526/245 |
| 5,489,641 | 2/1996 | Dershem | 524/439 |
| 5,528,157 | 6/1996 | Newberry et al. | 324/754 |
| 5,536,970 | 7/1996 | Higashi et al. | 257/676 |
| 5,548,884 | 8/1996 | Kim | 29/593 |
| 5,672,297 | 9/1997 | Soane | 252/511 |
| 5,744,533 | 4/1998 | Iwamoto | 524/440 |

FOREIGN PATENT DOCUMENTS

| | | | |
|---|---|---|---|
| 0 144 741 A1 | 6/1985 | European Pat. Off. | C09J 3/14 |
| 3423385 A1 | 1/1985 | Germany . | |
| WO 96/07691 | 3/1996 | WIPO | C08G 73/10 |

OTHER PUBLICATIONS

Johnstone and Rose, "A Rapid, Simple, and Mild Procedure for Alkylation of Phenols, Alcohols, Amides and Acids" *Tetrahedron* 35: 2169–2173 (1979).

*Primary Examiner*—Paul R. Michl
*Attorney, Agent, or Firm*—Gray Cary Ware & Freidenrich LLP; Stephen E. Reiter; Ramsey R. Stewart

[57] ABSTRACT

In accordance with the present invention, there are provided compositions based on defined hydrophobic vinyl monomers have excellent moisture resistance (and, hence are much less prone to give rise to "popcorning"), excellent handling properties (i.e., generally existing as a fluid material which does not require the addition of solvent to facilitate the use thereof), and excellent performance properties (e.g., good dielectric properties).

80 Claims, No Drawings

HYDROPHOBIC VINYL MONOMERS, FORMULATIONS CONTAINING SAME, AND USES THEREFOR

FIELD OF THE INVENTION

The present invention relates to formulations useful in a variety of applications related to the preparation of components employed in the electronics industry. In a particular aspect, the present invention relates to formulations useful for the preparation of laminates. In another aspect, the present invention relates to formulations useful for the preparation of solder masks. In yet another aspect, the present invention relates to formulations useful for the preparation of liquid encapsulant for electronic components. In still another aspect, the present invention relates to formulations useful for the preparation of non-hermetic electronic packages. In a still further aspect, the present invention relates to formulations useful for the preparation of die attach compositions.

BACKGROUND OF THE INVENTION

As the electronics industry advances, and production of light weight components increases, the development of new materials gives producers increased options for further improving the performance and ease of manufacture of such components. Materials used in the manufacture of electronic components include the resin required for the preparation of prepregs (which are, in turn, used for the preparation of multilayered printed circuit boards and printed wiring boards), resins used for the preparation of solder masks (which define solder areas on the multilayered printed wiring board), and resins used for preparation of glob top (which protects microelectronic devices from the environment).

Multilayered printed circuit boards are currently produced mainly by (a) a mass laminating technique and (b) a pin laminating technique. In these techniques, a printed circuit board for inner layer use (hereinafter, referred to as "inner-layer board") is first manufactured. This inner-layer board is combined with prepregs and then a copper foil or a single-side copper-clad laminate and the superposed laminating materials are laminated to give a multilayered board, both sides of which are constituted by a copper foil. This multi-layered structure is subjected to processing steps such as steps for forming through-holes, outer-layer printed circuits, etc.

The initial manufacture of resins used in laminates is usually conducted by chemical producers and supplied to the trade in a workable form. Addition of a curing agent or catalyst, as well as optional components such as diluents, flow promoters, fire retardants, and other modifying resins is performed by the user. This may be done in the interest of customization to the application or to ensure that pre-reaction of the formulation does not occur.

The catalyzed resin system is placed into a dip tank in which the glass cloth is immersed. The wet-coated cloth is squeezed between metering rolls to leave a measured amount of the resin system. Then it passes into a tunnel drier to remove any volatile materials (e.g., solvent if present) and usually to react the resin to a predetermined molecular weight. This ensures the proper amount of flow during lamination.

After the coated cloth has passed through the tunnel drier, the resin is high enough in $T_g$ to permit handling. At this stage, it is called prepreg; it can be cut into sheets or stored in roll form. Storage is often at room temperature, although some formulations require refrigeration.

Cut to size, sheets of prepreg are stacked between polished steel plates for placement in a laminating press. If printed circuits are to be made from the cured stock, copper foil is placed at the two surfaces of the stack. Otherwise, separator sheets or lubricants ensure removal of the plates from the cured laminate.

The conditions under which cure takes place vary with the resin type, thickness of the laminate, and other factors. Resin cure might be carried out, for example, at 175° C., from 250 to 1,000 psi, and for 30 to 60 minutes at temperature, followed by cooling. Certain resins (e.g., heat-resistant polymers) may require 200° C. or more for complete cure. Since steam-heated presses do not operate well above 175° C., frequently a partial cure is effected at this temperature and the remainder carried out in an oven at the higher temperature. Warpage is a definite possibility under such a procedure. Control of dimensional stability of laminate material and stability of assembled boards are both becoming more important, and the trend is toward higher $T_g$ resin material, laminated in a vacuum process to meet the fabrication-tolerance requirements and to reduce moisture absorption.

The behavior of high-reliability printed-circuit laminates may be improved by the addition of silane couplers to the resin materials employed for preparation of laminate. While the addition of couplers is intended to permit the resulting composites to be used in uncontrolled environments, many prior art materials appear to fail under certain conditions of high humidity and voltage stress. The result is the creation of copper-shorting filament plated along the glass surface. These may penetrate from one circuit element to another. Because the accelerating factors for this phenomenon are ionic contamination, humidity, voltage, and temperature, the chief test for suitability of the selected resin material and coupler for the intended use is the electrical resistance between interconnection lines or holes under voltage stress at high humidity.

When performing as intended, the coupler bonds the glass and cured resin strongly so that they act as a composite, although with anisotropic mechanical properties. Residual stresses in this composite affect the dimensional stability thereof. One source of these stresses is the glass fabric itself. The warp (machine direction) strands are flattened by tension during the impregnation process, while the crimp of the fill fibers is actually increased. Both are flattened during lamination. Repeat pressing raises the cured resin above its $T_g$; the softened material allows the glass fibers to relax, changing dimension. Temperature variation across the surface of the laminate during cure, resin flow to fill around elements in already circuitized substrates, as well as hole drilling; all create stress-induced dimensional change. Cross orienting alternate plies of the glass cloth can compensate glass-cloth tension, but in most cases, tracking such factors is not straightforward.

As a consequence, detailed correlation is lacking between dimensional change and the factors most predictive models assume for deformation; orthotopic contraction, warp, twist, and other high-order strain functions. Nonetheless, general effects are discernible, and the complex sequence of processes used to make multilayer boards is monitored and controlled based on computer predictive models derived from highly precise measurement techniques. This assures that the element in each layer will register to the others in the composite. Because moisture and temperature affect dimensions significantly compared with the factors discussed, prepregs, cores, and subcomposites are often temperature and humidity stabilized at critical process steps.

Another common use of resins in the electronics industry is for the preparation of solder masks. Solder mask is used to prevent excessive flow of solder in plastic packages. The material used must maintain the integrity of the physical, chemical, mechanical and environmentally related properties of the package. Solder masks were originally intended to be used on printed wiring boards (PWBs) as an aid to manufacturing, reducing the need for touch-up after machine soldering, reducing solder consumption, and providing mechanical protection for the main portion of the circuitry.

The main type of solder mask employed in the art is the "liquid photoimageable" solder mask. There are three primary methods of applying this type of soldermask: flood screen-coating, curtain and spray coating. Each method has both advantages and drawbacks. Screen coating, for example, is efficient in material usage, but through-holes may be plugged in the process. These holes must then be vacated during development. Curtain coating is also efficient, but it is also a much slower process due to the fact that only one side of a board can be coated at a time. Spray coating is the best method to accomplish complete fill and trace application, but this technique can result in substantial material losses (e.g., in the range of 10–30% waste).

Another common use of resins in the electronics industry is as a liquid encapsulant (also referred to as "glob top"), wherein an aliquot of resin material is used to encase a component to protect it from certain stresses and from exposure to the environment. To meet the industry's ever-increasing demand for device reliability, materials for encapsulant applications must meet increasingly stringent property requirements. Such requirements include excellent moisture resistance, ionic purity, low dielectric constant and good thermal properties. In the absence of these properties, especially in the presence of moisture and ionic impurities, corrosion (and ultimately failure of the device) will likely occur.

Yet another common use of resins in the electronics industry is in the preparation of non-hermetic electronic packages. Examples of such packages are ball grid array (BGA) assemblies, super ball grid arrays, IC memory cards, chip carriers, hybrid circuits, chip-on-board, multi-chip modules, pin grid arrays, and the like. In these structures, moisture resistance is an important consideration, both in terms of handling during assembly and reliability of the finished part. For example, absorption of moisture during assembly frequently leads to "popcorning" (the sometimes violent release of absorbed moisture upon heating to solder reflow temperatures). Accordingly, the development of moisture resistant resins for use in the preparation of non-hermetic electronic packages would be of great benefit to the art.

Accordingly, what is still needed in the art are materials which have good workability properties (e.g., fluid under typical processing conditions) and good performance properties (e.g., good adhesion, moisture resistance, etc.).

BRIEF DESCRIPTION OF THE INVENTION

In accordance with the present invention, it has been discovered that compositions based on defined vinyl monomers have excellent moisture resistance (and, hence are much less prone to give rise to "popcorning"), excellent handling properties (i.e., generally existing as a fluid material which does not require the addition of solvent to facilitate the use thereof), and excellent performance properties (e.g., good dielectric properties).

DETAILED DESCRIPTION OF THE INVENTION

In accordance with the present invention, there are provided die-attach pastes comprising:

a thermosetting resin composition, and optionally, in the range of about 20 up to about 90 wt % of a conductive filler, wherein said thermosetting resin composition comprises:
(a) at least two polyvinyl compounds of structure I as follows:

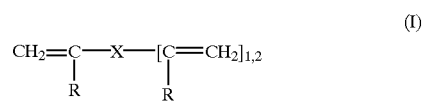
(I)

wherein X is a hydrophobic bridging group having in the range of about 7 up to about 400 carbon atoms, and R is H or methyl, wherein at least one compound of structure I has a $T_g \geq$ about 100° C., wherein at least one compound of structure I has a $T_g \leq$ about 0° C., and wherein the ratio of high $T_g$ component to low $T_g$ component is sufficient to provide desirable balance of high and low temperature die shear strength, flexibility and toughness;

(b) optionally, in the range of about 5 up to about 95 wt % of a monovinyl counterpart of a compound of structure I, having the structure II as follows:

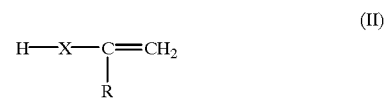
(II)

wherein R and X are as defined above;

(c) in the range of about 0.1 up to about 3 wt % of at least one free radical initiator, based on the total weight of the composition;

(d) optionally, in the range of about 1.0 up to about 60 wt % of at least one polyunsaturated comonomer, based on the total weight of the composition; and (e) optionally, a diluent.

Invention compositions are noteworthy for their excellent handling properties. Such compositions have desirably low viscosities which facilitate dispense operations. Typical viscosities fall in the range of about 10 up to about 12,000 centipoise, with viscosities in the range of about 70 up to about 2,000 centipoise being presently preferred.

In a preferred embodiment, thermosetting resin compositions employed for the preparation of die-attach pastes according to the invention further comprise:

(f) in the range of 0.05 up to 10 wt % of at least one coupling agent, based on the total weight of the composition.

Coupling agents contemplated for use herein include silicate esters, metal acrylate salts, titanates, compounds containing a co-polymerizable group and a chelating ligand, and the like.

Bridging groups, —X—, contemplated by the above generic formula include 4,8-bis(substituted)-tricyclo [5.2.1.0$^{2,6}$]decane, derivatives of dimer-diol (as available, for example, from Unichema North America, Chicago, Ill., under the designation Pripol 2033), i.e.,

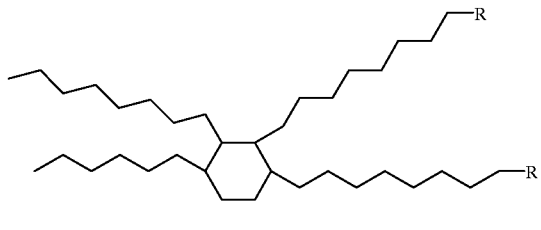

wherein R is an acrylate, methacrylate, vinyl ether, vinyl ester, allyl ether, allyl ester, and the like; derivatives of perhydro bisphenol A as well as other bisphenol derivatives, biphenyl derivatives, triphenyl methyl derivatives, 1,2-polybutadiene derivatives, 1,4-polybutadiene derivatives, mixed 1,2- and 1,4-polybutadiene derivatives, hydrogenated polybutadiene derivatives, polybutene derivatives, and the like.

Polyvinyl compounds contemplated for use in accordance with the present invention include acrylates of structure III as follows:

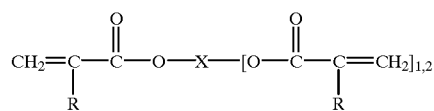

(III)

wherein X is a hydrophobic cyclic or acyclic aliphatic or aromatic bridging group having in the range of about 7 up to about 40 carbon atoms, and R is H or methyl.

Acrylates embraced by the above generic formula include 4,8-bis(acryloxymethyl)-tricyclo[$5.2.1.0^{2,6}$]decane, i.e.,

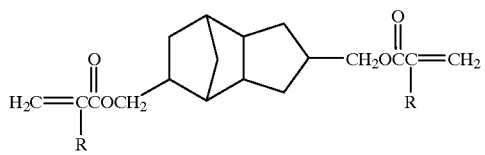

the diacrylate ester of dimer-diol (as available, for example, from Unichema North America, Chicago, Ill., under the designation Pripol 2033), i.e.,

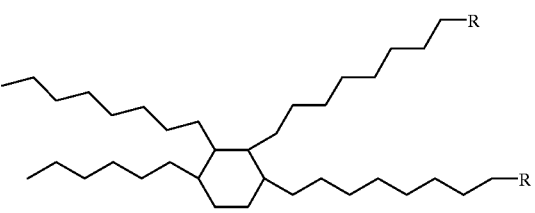

when R=$H_2C$=CH—C(O)O—; the diacrylate of 10,11-dioctyl-1,20-eicosane, the diacrylate of perhydro bisphenol A, i.e.,

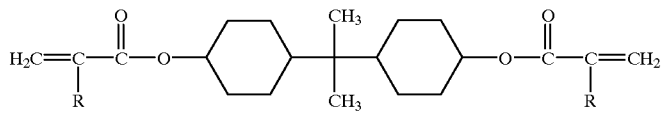

as well as the bisphenol derivatives:

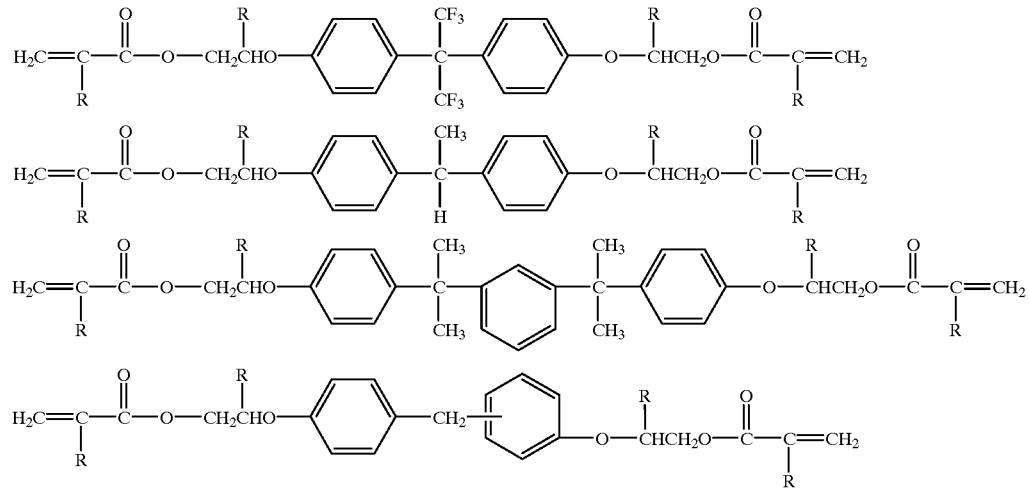

the biphenyl derivatives:

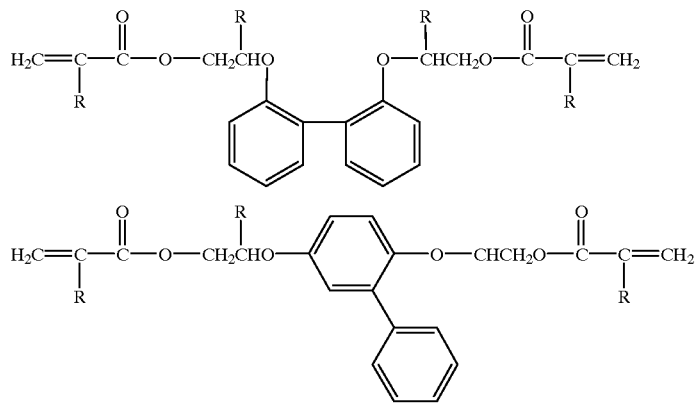

the triphenyl methyl derivative:

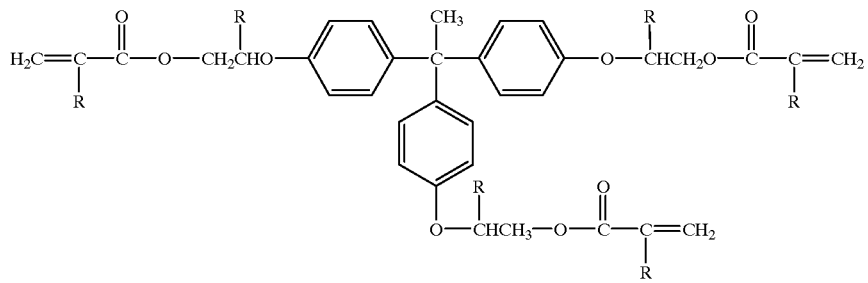

and the like.

Polyvinyl compounds contemplated for use in accordance with the present invention also include bis (para-substituted styrene) derivatives of structure IV as follows:

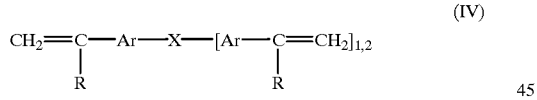

(IV)

wherein X is a hydrophobic cyclic or acyclic aliphatic bridging group having in the range of about 7 up to about 40 carbon atoms, and R is H or methyl.

Styrenic compounds embraced by the above generic formula include 4,8-bis(paravinylphenol)-tricyclo[$5.2.1.0^{2,6}$]decane

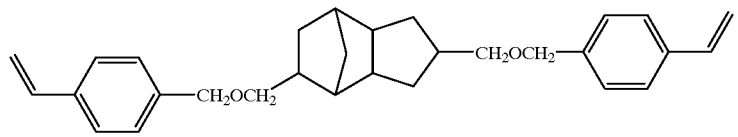

and the homolog thereof having the structure:

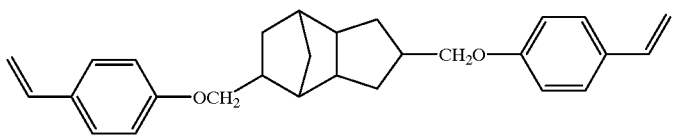

as well as styrenic derivatives of the various bisphenol backbones, biphenyl backbones and triphenyl methane backbones set forth above, and the like.

Polyvinyl compounds contemplated for use in accordance with the present invention also include polyvinyl ethers of structure V as follows:

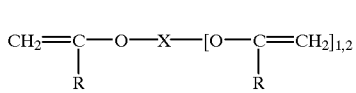

(V)

wherein X is a hydrophobic cyclic or acyclic aliphatic bridging group having in the range of about 7 up to about 40 carbon atoms, and R is H or methyl.

Vinyl ethers embraced by the above generic formula include 4,8-bis(paravinyl hydroxymethyl benzene)-tricyclo[5.2.1.0$^{2,6}$]decane, the divinyl ether having the structure:

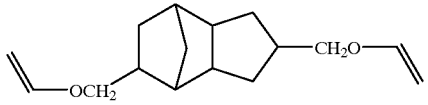

as well as vinyl ether derivatives of the various bisphenol backbones, biphenyl backbones and triphenyl methane backbones set forth above, and the like.

Polyvinyl compounds contemplated for use in accordance with the present invention also include polyvinyl esters of structure VI as follows:

(VI)

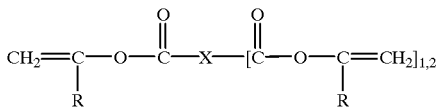

wherein X is a hydrophobic cyclic or acyclic aliphatic bridging group having in the range of about 7 up to about 40 carbon atoms, and R is H or methyl.

Polyvinyl esters embraced by the above generic formula include the 4,8-divinyl ester of tricyclo[5.2.1.0$^{2,6}$]decane, i.e.,

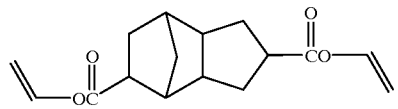

the divinyl ester of dimer diacid, i.e.,

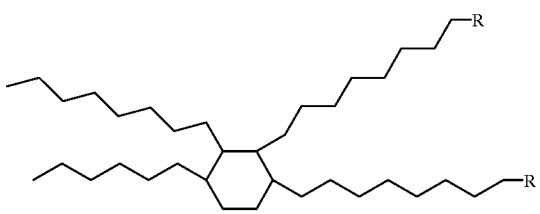

when R=H$_2$C=CH—O—C(O)—, cyclohexyl derivatives such as:

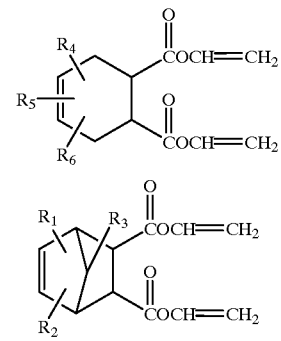

as well as vinyl ester derivatives of the various bisphenol backbones, biphenyl backbones and triphenyl methane backbones set forth above, and the like.

Polyvinyl compounds contemplated for use in accordance with the pre sent invention also include polyvinyl amides of structure VII as follows:

(VII)

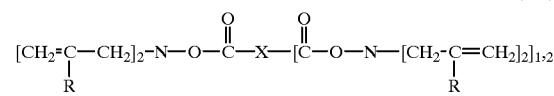

wherein X is a hydrophobic cyclic or acyclic aliphatic bridging group having in the range of about 7 up to about 40 carbon atoms, and R is H or methyl.

Bisallyl amides embraced by the above generic formula include polyvinyl amides having the structure:

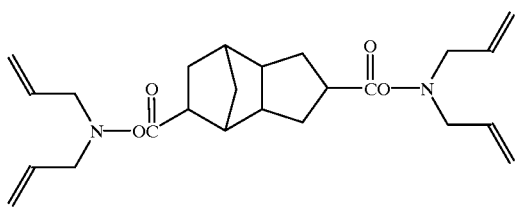

as well as bisallyl amide derivatives of the various bisphenol backbones, biphenyl backbones and triphenyl methane backbones set forth above, and the like.

Those of skill in the art recognize that a variety of monofunctional counterparts of the above-described polyvinyl compounds are commercially available and/or can readily be prepared, such as, for example, the monofunctional compounds:

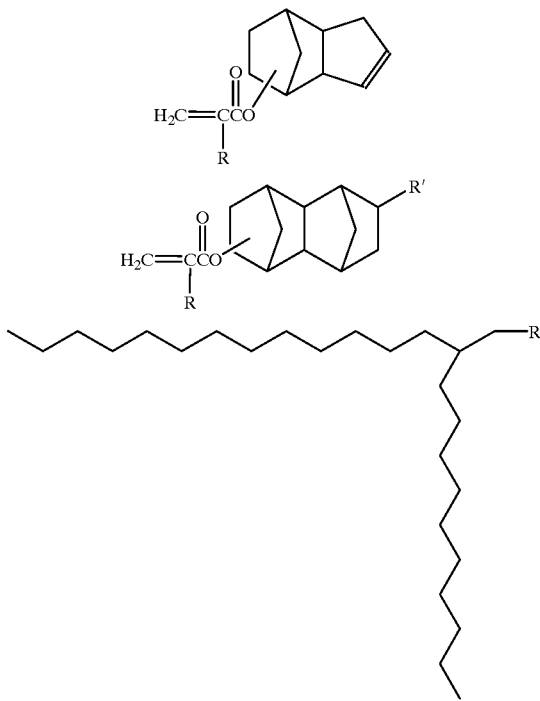

It is also possible for compounds bearing a plurality of vinyl functionalities to be employed in the practice of the present invention, such as, for example, the polyfunctional compound set forth below

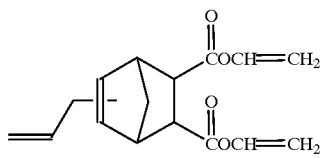

The ratio of high $T_g$ materials to low $T_g$ materials suitable for use in the practice of the present invention can vary within wide ranges, so long as the ratio employed is sufficient to provide the desired balance of high and low temperature die shear strength, flexibility and toughness. Presently preferred ratios of high $T_g$ materials to low $T_g$ materials typically fall in the range of about 1:20 up to about 4:1 parts of high $T_g$ material, relative to low $T_g$ material (i.e., in the range of about 5% up to about 80% of the high $T_g$ material, with the remainder being low $T_g$ material).

Presently preferred high $T_g$ materials contemplated for use in the practice of the present invention include:

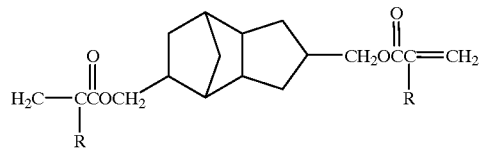

wherein R is H or methyl. Presently preferred low $T_g$ materials contemplated for use in the practice of the present invention include:

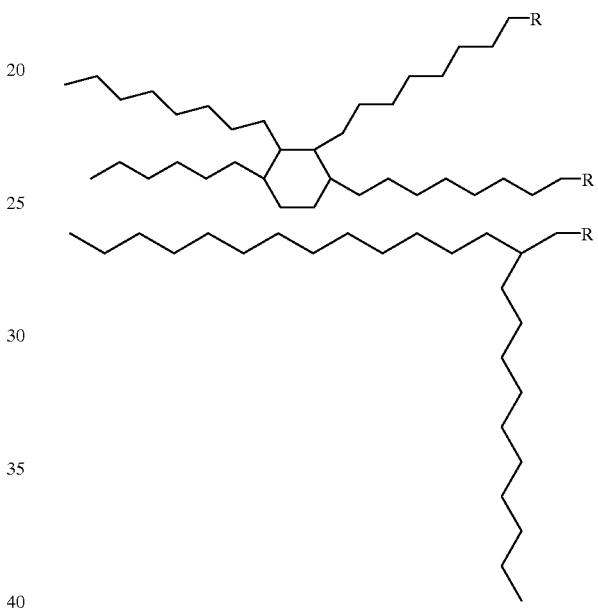

wherein R is an acrylate or a methacrylate moiety.

As readily recognized by those of skill in the art, a wide variety of curing catalysts can be employed in the preparation of invention compositions. The preferred catalyst to be used will, of course, depend on the monomer vehicle employed. Monomers contemplated for use herein cure by a free radical mechanism, thus free radical initiators such as peroxy esters, peroxy carbonates, hydroperoxides, alkylperoxides, arylperoxides, azo compounds, and the like can be employed.

In addition, catalysts which promote cationic cure can also be used. Such catalysts are especially useful when the monomers used are polyvinyl ethers. Examples of suitable cationic cure catalysts include onium salts, iodonium salts, sulfonium salts, and the like.

Polyunsaturated comonomers contemplated for optional inclusion in formulations contemplated by the present invention include polybutadiene, hydrogenated polybutadiene (including partially hydrogenated polybutadiene), maleinized polybutadiene, acrylonitrile copolymers, polyterpenes, and the like.

Reactive diluents contemplated for optional inclusion in formulations contemplated by the present invention include any reactive diluent which, in combination with the vinyl monomer-based formulations described herein, forms a thermosetting resin composition. Such reactive diluents include acrylates and methacrylates of monofunctional and polyfunctional alcohols, ethylenically unsaturated compounds, styrenic monomers (i.e., ethers derived from the reaction of vinyl benzyl chlorides with mono-, di-, or trifunctional hydroxy compounds), and the like. When used, reactive diluents are typically present in the range of about 5 up to 15 wt %, relative to the weight of the base formulation.

While the use of inert diluents is not excluded from the practice of the present invention, it is generally preferred that compositions according to the invention remain substantially free of solvent, so as to avoid the potentially detrimental effects thereof, e.g., creation of voids caused by solvent escape, the environmental impact of vaporized solvent, the redeposition of outgassed molecules in the surface of the article, and the like. When used, suitable inert diluents include dimethylformamide, dimethylacetamide, N-methylpyrrolidone, toluene, xylene, methylene chloride, tetrahydrofuran, glycol ethers, methyl ethyl ketone or monoalkyl or dialkyl ethers of ethylene glycol, polyethylene glycol, propylene glycol, polypropylene glycol, and the like. When used, inert diluents are typically present in the range of about 10 up to 40 wt %, relative to the weight of the base formulation.

Fillers traditionally employed for the preparation of resin materials having electrically insulating properties are non-conductive materials such as, for example, aluminum nitride, boron nitride, alumina, silicon dioxide, polytetrafluoroethylene (e.g., Teflon), and the like. Those of skill in the art readily recognize that the desirability of including filler in the invention composition will depend on the end use contemplated therefor. Thus, for example, when preparing compositions for use as a solder mask, filler is not typically employed. Conversely, when preparing compositions for use as a liquid encapsulant, it is desirable to include substantial quantities of filler therein (typically in the range of about 10 up to 75 wt % filler, relative to the weight of the base formulation).

Examples of electrically conductive fillers contemplated for use in the practice of the present invention include, for example, silver, nickel, cobalt, copper and aluminum fillers, as well as alloys of such metals, and non-conductive metals on which such metals are deposited. Both powder and flake forms of filler may be used in the attach paste compositions of the present invention.

In another aspect, invention compositions can optionally further contain one or more of the following additional components: anti-oxidants/inhibitors, bleed control agents, adhesion promoters, flexibilizers, dyes, pigments, and the like.

Anti-oxidants/inhibitors contemplated for use in the practice of the present invention include hindered phenols (e.g., BHT (butylated hydroxytoluene), BHA (butylated hydroxyanisole), TBHQ (tertiary-butyl hydroquinone), 2,2'-methylenebis(6-tertiarybutyl-p-cresol), and the like), hindered amines (e.g., diphenylamine, N,N'-bis(1,4-dimethylpentyl-p-phenylene diamine, N-(4-anilinophenyl) methacrylamide, 4,4'-bis(",''-dimethylbenzyl) diphenylamine, and the like), phosphites, hindered amine N-oxides (e.g., 2,2,6,6-tetramethyl-1-piperidinyloxy, free radical (TEMPO)), and the like. When used, the quantity of anti-oxidant typically falls in the range of about 100 up to 2000 ppm, relative to the weight of the base formulation.

Anti-bleed agents contemplated for use in the practice of the present invention include cationic surfactants, tertiary amines, tertiary phosphines, amphoteric surfactants, polyfunctional compounds, and the like, as well as mixtures of any two or more thereof. Those of skill in the art recognize that the quantity of bleed control agent employed in the practice of the present invention can vary widely, typically falling in the range of about 0.1 up to about 10 wt %, relative to the weight of the base formulation.

Adhesion promoters contemplated for use in the practice of the present invention include polymers that have pendant acid or latent acid groups that can increase adhesion. An example is the Ricon R-130 20% maleated (Ricon Resins, Inc., Grand Junction, Colo.), a polybutadiene with anhydride groups that can react with a surface to increase adhesion. When present, adhesion promoters are typically present in the range of about 5 up to 30 wt % relative to the weight of the base formulation.

Flexibilizers contemplated for use in the practice of the present invention include branched polyalkanes or polysiloxanes that lower the $T_g$ of the formulation. An example of such a material would be polybutadienes such as the Ricon R-130 as described hereinabove. When present, flexibilizers are typically present in the range of about 15 up to about 60 wt %, relative to the weight of the base formulation.

Dyes contemplated for use in the practice of the present invention include nigrosine, Orasol blue GN, phthalocyanines, and the like. When used, organic dyes in relatively low amounts (i.e., amounts less than about 0.2 wt %) provide contrast.

Pigments contemplated for use in the practice of the present invention include any particulate material added solely for the purpose of imparting color to the formulation, e.g., carbon black, metal oxides (e.g., $Fe_2O_3$, titanium oxide), and the like. When present, pigments are typically present in the range of about 0.5 up to about 5 wt %, relative to the weight of the base formulation.

As readily recognized by those of skill in the art, the quantity of the various components employed to prepare invention compositions can vary within wide ranges. For example, preferred compositions contemplated for use in accordance with the present invention comprise:

in the range of about 10 up to about 50 wt % of a thermosetting resin composition (with in the range of about 15–35 wt % being especially preferred), and in the range of about 50 up to about 90 wt % of a conductive filler (with in the range of about 65–85 wt % being especially preferred).

Preferred thermosetting resin compositions contemplated for use in accordance with the present invention comprise:

in the range of about 5 up to about 90 wt % of said combination of at least two polyvinyl compounds, in the range of about 5 up to about 75 wt % of said monovinyl compound having the structure II, in the range of about 0.5 up to about 2 wt % of said at least one free radical initiator, in the range of about 5 up to about 45 wt % of said at least one polyunsaturated comonomer, and in the range of about 0.1 up to about 5 wt % of said coupling agent.

In accordance with another embodiment of the present invention, there are provided assemblies comprising a microelectronic device permanently adhered to a substrate by a cured aliquot of the die attach paste according to the invention, as described in detail herein. Examples of the types of articles contemplated for preparation in accordance with the present invention include laminated circuit boards (i.e., the first article and the second article are separate layers of a laminate structure), printed wiring boards, and the like.

Examples of the base materials contemplated for use in the preparation of laminates include woven fabrics of various glasses such as E-glass, S-glass, SII-glass, D-glass, quartz glass, and the like, and other inorganic woven fabrics such as alumina paper; woven fabrics made of super heat-resistant resins such as all-aromatic polyamides, polyimides, fluoroplastics, poly(phenylene sulfide), polyetheretherketones, polyetherimides, liquid-crystal polyester resins, and the like; woven fabrics obtained using composite yarns comprising combinations of fibers of the above inorganic materials and fibers of the above super heat-resistant resins; and other woven fabrics including those comprising suitable combinations of the above.

In accordance with yet another embodiment of the present invention, there are provided methods for adhesively attaching a first article to a second article, said method comprising:

(a) applying die attach paste according to the invention to said first article, (b) bringing said first and second article into intimate contact to form an assembly wherein said first article and said second article are separated only by the adhesive composition applied in step (a), and thereafter, (c) subjecting said assembly to conditions suitable to cure said adhesive composition.

Articles contemplated for assembly employing invention compositions include memory devices, ASIC devices, microprocessors, flash memory devices, and the like.

Conditions suitable to cure invention die attach compositions comprise subjecting the above-described assembly to a temperature of less than about 200° C. for about 0.25 up to 2 minutes. This rapid, short duration heating can be accomplished in a variety of ways, e.g., with an in-line heated rail, a belt furnace, or the like.

In accordance with still another embodiment of the present invention, there are provided methods for adhesively attaching a microelectronic device to a substrate, said method comprising:

(a) applying die attach paste according to the invention to said substrate and/or said microelectronic device, (b) bringing said substrate and said device into intimate contact to form an assembly wherein said substrate and said device are separated only by the die attach composition applied in step (a), and thereafter, (c) subjecting said assembly to conditions suitable to cure said die attach composition.

Microelectronic devices contemplated for use with invention die attach pastes include copper lead frames, Alloy 42 lead frames, silicon dice, gallium arsenide dice, germanium dice, and the like.

In accordance with a still further embodiment of the present invention, there are provided compositions useful for protecting solder interconnections between semiconductor devices and supporting substrates, said compositions comprising:

in the range of about 20 up to about 80 wt % of a curable thermosetting polyvinyl-based binder system, wherein said binder system has a viscosity at room temperature of no greater than about 2,500 centipoise, and in the range of about 20 up to about 80 wt % of a filler having a maximum particle size of about 50 microns, wherein wt % is based on the total weight of the composition unless otherwise indicated, wherein said binder system comprises:

(a) at least two polyvinyl compounds of structure I as defined above (preferably in the range of about 70–95 wt % of said polyvinyl compounds are high $T_g$ materials, and in the range of about 5–30 wt % of said polyvinyl compounds are low $T_g$ materials, based on the total weight of the binder system);

(b) optionally, in the range of about 5 up to about 95 wt % of a monovinyl counterpart of a compound of structure I, having the structure II as defined above;

(c) in the range of about 0.1 up to about 3 wt % of at least one free radical initiator, based on the total weight of the binder system;

(d) optionally, in the range of about 1 up to about 60 wt % of at least one polyunsaturated comonomer, based on the total weight of the binder system;

(e) optionally, a diluent, and (f) optionally, a surfactant.

Fillers contemplated for use particularly in this embodiment of the present invention are preferably substantially spherical, or at least the majority of the filler particles are substantially spherical, so as to facilitate flow of invention composition into the gaps which form between the supporting substrate and the semiconductor device to which it is attached. Fillers suitable for use herein are further characterized as having a low coefficient of thermal expansion, as being substantially non-conductive, and as having low levels of extractable ions. In addition, fillers contemplated for use herein desirably have an emission rate of less than about 0.01 alpha particles/cm²-hr.

Particle sizes of fillers employed in accordance with this embodiment of the present invention are typically 50 microns or less, preferably not greater than about 35 microns and most preferably not greater than about 25 microns. Most preferably at least about 90 weight % of the particles are no smaller than about 0.7 microns. Smaller particle sizes are necessary so that the composite polymer material will readily flow in the gap between the chip and substrate carrier. The gap is normally about 25 to about 50 microns, but in some cases is somewhat larger (e.g., about 75 to about 125 microns). Presently preferred fillers have average particle sizes in the range of about 0.5 up to about 20 micrometers, with particle sizes in the range of about 3 to about 10 microns being especially preferred, even though there may be a distribution of a minor amount of some larger particles.

In addition, according to a preferred aspect of the present invention, the filler is substantially free of alpha particle emissions such as produced from the trace amounts of radioactive impurities (e.g., uranium and thorium) normally present in conventional silica or quartz fillers. The preferred fillers employed in the practice of the present invention have emission rates of less than 0.01 alpha particles/cm²-hr and most preferably less than 0.005 alpha particles/cm²-hr.

The presence of "-particle emissions (primarily caused by the presence of uranium and thorium isotopes in the fillers) can generate electron/hole pairs, which in turn would be detrimental to the device. A presently preferred filler is high purity fused or amorphous silica or synthetic glass commercial fillers which typically are rounded filler particles. A commercially available filler that can be employed is DP4910 from PQ Corporation. The preferred filler can optionally be treated with a coupling agent.

Exemplary fillers contemplated for use in accordance with this embodiment of the present invention include alumina, aluminum nitride, boron nitride, borosilicate glass, diamond dust, silica, quartz, silicon, silicon carbide, titania, zirconium tungstate, and the like, optionally treated with coupling agents and/or lubricants.

Optionally, in accordance with this aspect of the present invention, compositions contemplated for use for protecting solder interconnections can further comprise one or more of the following additional components, e.g., coupling agents, thixotropes, dyes, anti-oxidants, surfactants, inert diluents, reactive diluents, anti-bleed agents, fluxing agents, and the like.

Coupling agents (also referred to herein as adhesion promoters) contemplated for use in the practice of the present invention include silicate esters, metal acrylate salts (e.g., aluminum methacrylate), titanates (e.g., titanium methacryloxyethylacetoacetate triisopropoxide), or compounds that contain a copolymerizable group and a chelating ligand (e.g., phosphine, mercaptan, acetoacetate, and the like). When added to invention compositions, generally in the range of about 0.1 up to 5 wt % of at least one coupling agent (based on the total weight of the organic phase) will be employed, with in the range of about 0.5 up to 2 wt % preferred.

Presently preferred coupling agents contain both a co-polymerizable function (e.g., vinyl moiety, acrylate moiety, methacrylate moiety, styrene moiety, cyclopentadiene moiety, and the like), as well as a silicate ester function. The silicate ester portion of the coupling agent is capable of condensing with metal hydroxides present on the mineral surface of the substrate, while the co-polymerizable function is capable of co-polymerizing with the other reactive components of invention adhesive composition. Especially preferred coupling agents contemplated for use in the practice of the invention are oligomeric silicate coupling agents such as poly(methoxyvinylsiloxane).

Thixotropes contemplated for use in the practice of the present invention include fumed alumina, fumed silica, fumed titanium dioxide, graphite fibrils, teflon powder, organo-modified clays, thermoplastic elastomers, and the like.

Dyes contemplated for use in the practice of the present invention include nigrosine, Orasol blue GN, non-electrically conductive carbon black, and the like. When used, organic dyes in relatively low amounts (i.e., amounts less than about 0.2 wt %) provide contrast.

Anti-oxidants contemplated for use in the practice of the present invention include hindered phenols (e.g., BHT (butylated hydroxytoluene), BHA (butylated hydroxyanisole), TBHQ (tertiary-butyl hydroquinone), 2,2'-methylenebis(6-tertiarybutyl-p-cresol), and the like), hindered amines (e.g., diphenylamine, N,N'-bis(1,4-dimethylpentyl-p-phenylene diamine, N-(4-anilinophenyl) methacrylamide, 4,4'-bis(",''-dimethylbenzyl) diphenylamine, and the like), phosphites, and the like.

Surfactants contemplated for use in the practice of the present invention include silanes and non-ionic type surface active agents. Surfactants in amounts of about 0.5 wt % up to about 3 wt % (preferably about 1.2 wt % up to about 1.6 wt % can be used to facilitate mixing the filler with the invention resin system.

Fluxing agents contemplated for use in the practice of the present invention include propargyloxy ethers of hydroxy derivatives of aromatic carboxylic acids (e.g., the proparpyloxy ether of parahydroxy benzoic acid), and the like.

Anti-bleed agents contemplated for use in the practice of the present invention include cationic surfactants, tertiary amines, tertiary phosphines, amphoteric surfactants, polyfunctional compounds, and the like, as well as mixtures of any two or more thereof.

Invention compositions typically have excellent handling properties. For example, the viscosity of invention compositions at room temperature generally fall in the range of about 3,000 up to about 150,000 centipoise, with viscosities at room temperature in the range of about 20,000 up to about 60,000 centipoise being readily attainable.

Even where invention compositions have relatively high viscosities at room temperature, these materials have excellent handling properties at typical working temperatures (in the range of about 70° C. up to about 100° C.). Under such conditions, invention compositions typically have viscosities of no greater than about 3,000 centipoise.

Viscosity ranges for commercial epoxy-based underfills are between about 4,000–10,000 cps at 25° C. and 400–800 cps at 70° C. Two viscosity values are given per underfill because underfills are dispensed at ambient temperature and flowed at elevated temperatures (70° C.) Invention underfill materials are also capable of achieving the same performance.

The viscosity of the underfill material is dominated by the viscosity of the resin formulation, the filler morphology, filler particle size, and filler loading. Typically, very low to low viscosity resins (i.e., 50–500 cps), spherical, high purity silica filler having a diameter less than about 10 microns, and between 60–70% wt filler loadings yield underfill encapsulant of acceptable viscosity.

A particularly important consideration with respect to underfill materials is the viscosity-flow rate relationship. To a first approximation, the viscosity of the underfill can be represented as a Newtonian fluid, thus the flow rate is directly proportional to the viscosity, i.e., higher viscosity portends a slower flow rate. Since time of ingression is of critical importance to the user, the goal is typically to formulate at the lowest viscosity possible.

Common to the industry is the trend towards minimizing process times. In addition to fast flowing underfills, there is also pressure to develop low temperature, fast curing underfill materials. Traditional epoxy-based underfill materials cure slowly, necessitating an upper cure temperature limit of about 165° C. over a 1–2 hour period. In the last few years, epoxy snap cure materials have emerged, curing at temperatures as low as 130° C. for less than 15 minutes are typical.

The vinyl monomer-based underfill materials of the present invention achieve both low temperature and fast cure. The free radical, addition polymerization cure mechanism yields acrylic resin systems which are stable at the flow temperature (70° C.) but cure rapidly above about 100° C. Typical to an acrylic resin system is a cure onset range between about 100–130° C. and a cure peak maximum at between about 120–150° C. The final cure properties are developed within 15 minutes of cure.

High purity, spherical, silica filler is the industry standard. Most epoxy encapsulants use a size fraction either below 5 micron or between 5 and 10 microns.

These ranges allow the underfill material to ingress as rapidly as possible while minimizing separation and settling from the resin upon ingression.

The only function of filler is to lower the coefficient of thermal expansion (CTE). By blending silica filler (having a CTE of about 2.5 ppm) and the resin (~80–200 ppm), the CTE can be lowered close to the CTE of the solder bumps (~18 ppm). Thus, CTE controls the level of filler used within a system.

Many of the standards used over the last few years are changing due to the changing dimensions of the flip chip, and CTE is no exception. The trend toward the lowest CTE achievable seems to giving way to a much broader range of between about 25–50 ppm. Thus most of the underfill materials according to the invention possess CTE values between about 28–38 ppm.

The glass transition is considered to be the upper working temperature of the underfill. Since is it the function of the underfill to support the bumps by immersing them in a rigid environment capable of dissipating the stress caused by thermal cycling, the temperature at which the encapsulant transitions from its glass phase to rubbery phase is critical. Typically, $T_g$s for epoxy underfills are between about 130 and 160° C., but there are many epoxy materials with $T_g$s as low as 110° C. The vinyl monomer-based encapsulants described herein are typically high $T_g$ materials, typically well above 160° C., and more in the range of 200° C. or greater.

As noted above, underfill materials work by supporting the bumps (the electrical interconnects between the die and the substrate) in an high modulus encapsulant, and the "stiffness" (elastic moduli) of the encapsulant has been strongly correlated to the electrical reliability enhancement induced by encapsulation. For example, "hard" (8–10 GPa) encapsulants yield higher reliability (able to survive more thermal cycles, i.e., −55 to +150° C., without loss of continuity) than "soft" (4–6 GPa) encapsulants. Most of the vinyl monomer-based encapsulants described herein are between 4–8 GPa. Although this range is midway between the two ranges listed above, the elastic modulus ranges for successful encapsulation is also in redefinement in the industry, especially with the shrinking of the bump height (i.e., 1 mil).

In summary, the properties of invention underfill materials can be compared to typical properties of prior art epoxy-based materials as follows:

| Parameter | Commercial (epoxy) | Invention |
|---|---|---|
| Viscosity | | |
| at 25° C. | 4,000–10,000 cps | 4,000–10,000 cps |
| at 70° C. | 400–800 cps | 400–800 cps |
| Cure Speed | 15 to 60 minutes | <15 minutes |
| Cure Temperature | 150–165° C. | 130–165° C. |
| CTE | 22–28 ppm | 28–38 ppm |
| Tg | 110–160° C. | >160° C. |
| Elastic Modulus | 6–10 GPa | 4–8 GPa |

In accordance with yet another embodiment of the present invention, there are provided methods for protecting solder interconnections between semiconductor devices and supporting substrates therefor, said methods comprising:

attaching said device to said substrate by a plurality of solder connections that extend from the supporting substrate to electrodes on said semiconductor device, thereby forming a gap between said supporting substrate and said semiconductor device, filling said gap with a composition according to the invention, and subjecting said composition to curing conditions.

Substrates contemplated for use herein can be based on either organic material, inorganic material, or combinations thereof. For example, organic substrates contemplated for use herein include thermoplastic and thermosetting resins. Typical thermosetting resinous materials include epoxy, phenolic-based materials, polyimides and polyamides. Such materials are usually molded of the resinous material along with a reinforcing agent such as a glass-filled epoxy or phenolic-based material. Examples of some phenolic-type materials include copolymers of phenol, resorcinol, and cresol. Examples of some suitable thermoplastic polymeric materials include fluorinated polymeric materials, polyolefins such as polypropylene, polysulfones, polycarbonates, nitrile rubbers and ABS polymers.

Selection of a particular organic resin will depend in part on the processing temperatures that the substrate will be subjected to during the soldering. For example, fluorinated polymeric materials contemplated for use herein are well-known and include such commercially available polyfluoroalkylene materials as polytetrafluoroethylene, copolymers of tetrafluoroethylene and hexafluoropropylene, copolymers of tetrafluoroethylene and perfluoro-2,2-dimethyl-1,3 dioxide, polytrifluorochloroethylene, copolymers of tetrafluoroethylene with, for example, olefins such as ethylene; copolymers of trifluoromonochloroethylene with for example olefins such as ethylene, polymers of perfluoroalkyl vinyl ether.

Some commercially available fluorinated polymeric materials which are suitable for use in the practice of the present invention include those available under the trade designation TEFLON PTFE (polymers of tetrafluoroethylene), TEFLON FEP (perfluorinated ethylene-propylene copolymers); TEFLON PFA (copolymer of tetrafluoroethylene and perfluoroalkoxy); TEFZEL (copolymer of tetrafluoroethylene and ethylene); HALAR (copolymer of chlorotrifluoroethylene and ethylene); KEL-F (polymer of chlorotrifluoroethylene); HBF-430 (polymer of chlorotrifluoroethylene) and TEFLON AF (copolymer of tetrafluoroethylene and at least 65 mole % of perfluoro-2, 2-dimethyl-1,3 dioxide). The preferred fluorinated polymeric material is polytetrafluoroethylene (e.g., TEFLON). Commercially available fluorocarbon polymers reinforced with fiber glass are available from Rogers Corporation under the trade designation RO2800 and RO2500.

The polyimides that can be used as substrates in accordance with this aspect of the present invention include unmodified polyimides, as well as modified polyimides such as polyester imides, polyamide-imide-esters, polyamide-imides, polysiloxane-imides, as well as other mixed polyimides. Such are well-known in the prior art and need not be described in any great detail.

Typical epoxy resins employed in the practice of the present invention include the bisphenol A type resins obtained from bisphenol A and epichlorohydrin, resinous materials obtained by the epoxidation of novolak resins (produced from a phenolic material such as phenol and an aldehyde such as formaldehyde) with epichlorohydrin, polyfunctional epoxy resins such as tetraglycidyldiaminodiphenyl methane and alicyclic epoxy resins such as bis(3,4-epoxy-6-methyl-cyclohexylmethyl) adipate. The presently most preferred epoxy employed in the practice of the present invention is the bisphenol A type.

The epoxy resinous compositions also can contain accelerating agents and curing agents as are well-known in the art. Examples of suitable curing agents include polyamines, primary, secondary, and tertiary amines, polyamides, polysulfides, urea-phenol-formaldehyde, and acids or anhydrides thereof. In addition, suitable curing agents include Lewis acid catalysts such as $BF_3$ and complexes thereof.

Many of the organic substrates employed in accordance with the present invention contain the resin and a reinforcing fiber such as fiberglass, polyamide fiber mats (e.g., Kevlar), graphite fiber mats, Teflon fiber mats, and the like. Such compositions containing fibers are usually prepared by impregnating the fibers with, for instance, a composition of a suitable polymer. The amount of the polymer composition is usually about 30% to about 70% by weight (with about 50% to about 65% by weight preferred) of the total solids content of the polymer composition of the fiber support.

In the case of epoxy compositions, for example, such can be prepared by combining with the reinforcing fibers, and then curing to the B-stage and cutting to the desired shape, such as a sheet. When sheets are employed, the thickness is usually about 1.5 mils to about 8 mils. Curing to the B-stage is generally achieved by using temperatures of about 80° C. to about 110° C. for about 3 minutes to about 10 minutes.

If desired, the substrate can then be laminated onto other substrates as well as being interposed between the above electrically conductive patterns present in the support layers. The laminating can be carried out by pressing together the desired structure in a preheated laminating press at a predetermined pressure and temperature as, for example, about 200 psi to about 300 psi at about 180° C. The time of the pressing operation is variable depending upon the particular materials employed and the pressure applied. About 1 hour is adequate for the above conditions.

The organic substrates include the desired electrically conductive circuitry on the top and/or bottom surfaces of the substrate and/or on interior planes of the substrate as well known.

Next, in order to connect the electrically conductive patterns on opposing surfaces of the dielectric material, through-holes in the structure can be made. The through-holes can be obtained by drilling or punching operations including mechanical drilling and laser drilling and subsequently plated.

The organic substrates are generally about 3 to about 300 mils thick and more usually about 40 to about 100 mils thick.

Inorganic substrates contemplated for use herein include silicon supports, ceramic supports (e.g., silicon carbide supports, aluminum nitride supports, alumina supports, berrylia supports, and the like), sapphire supports, porcelain coated on steel, and the like.

Dispense and flow conditions employed for applying invention compositions are preferably selected such that the composition forms fillets on all four side walls of the chip. Thus, invention compositions can be applied by dispensing through nozzles under pressure of about 15 to about 90 psi and temperatures of about 25° C. to about 90° C. The compositions preferably completely cover the solder bump interconnections.

If desired, the flow of the compositions under the chip can be accelerated by heating for about 2 to about 20 minutes, typically about 15 minutes at about 40° C. to about 90° C.

Also, if desired, the compositions can be pregelled by heating for about 6 to about 60 minutes typically about to about 15 minutes at about 110° C. to about 130° C. and preferably about 6 to about 10 minutes at about 115° C. to about 120° C.

Curing conditions contemplated for use in the practice of the present invention comprise subjecting the composition to a temperature of up to about 170° C. for up to about 2 hours. Preferably, curing will be carried out at a temperature of up to about 150° C. for up to about 1 hour, with curing at temperatures below about 140° C. for up to about 0.5 hour being presently preferred.

In accordance with still another embodiment of the present invention, there are provided articles comprising a circuit board having a solder mask deposited thereon, wherein said solder mask is prepared from compositions according to the invention. When used for this purpose, it is preferred that invention compositions contain no filler, which is usually avoided in such applications.

Conditions suitable to cure invention compositions when used for the preparation of solder mask include thermal curing (as detailed hereinabove) as well as light initiated curing (employing, for example, visible light, ultraviolet, infrared irradiation, and the like).

In accordance with a still further embodiment of the present invention, there are provided articles comprising an electronic component encased within an aliquot of composition according to the invention. When used for this purpose, filler is commonly included is such compositions. Presently preferred fillers employed for such purpose include silica, alumina, and the like.

It is especially desirable that the material applied to encase an electronic component therein be handled and dispensed in such a manner that the introduction of voids in the encapsulation material is avoided.

In accordance with a still further embodiment of the present invention, there are provided improved methods for the synthesis of acrylate or methacrylate (i.e., (meth) acrylate) derivatives of hydrophobic species (e.g., the hydrophobic bridging groups, X, as described hereinabove, typically having in the range of about 7 up to about 400 carbon atoms). The improved synthetic methods of the invention comprise including an effective amount of a stable, hindered amine oxide free radical in the condensation reaction mixture used for the preparation of the (meth)acrylate product.

Examples of stable, hindered amine oxide free radicals contemplated for use herein include 2,2,6,6-tetramethyl-1-piperidinyloxy, free radical (TEMPO), 2,2,6,6-tetramethyl-4-(methylsulfonyloxy)-1-piperidinooxy, free radical, 3-carbamoyl-2,2,5,5-tetramethyl-3-pyrrolin-1-yloxy, free radical, 4-(4-nitrobenzoyloxy)-TEMPO, free radical, 4-acetamido-TEMPO, free radical, 4-amino-TEMPO, free radical, 4-carboxy-TEMPO, free radical, 4-cyano-TEMPO, free radical, 4-hydroxy-TEMPO benzoate, free radical, 4-hydroxy-TEMPO, free radical, 4-oxo-TEMPO, free radical, 4-phenyl-2,2,5,5-tetramethyl-3-imidazolin-1-yloxy-3-oxide, free radical, di-tert-butyl nitroxide, tert-amyl-tert-butyl nitroxide, 3,3,5,5-tetramethyl-1-pyrroline N-oxide, 5,5-dimethyl-1-pyrroline N-oxide, N,N-dimethyldodecylamine N-oxide, N,N-dimethylheptylamine N-oxide, N,N-dimethylnonylamine N-oxide, N,N-dimethyloctylamine N-oxide, N,N-dimethylundecylamine N-oxide, trimethylamine N-oxide, and the like. An effective amount of said stable, hindered amine oxide free radical contemplated for use herein typically falls in the range of about 0.01 up to about 2 mol %, based on the moles of the hydrophobic reactant.

The invention will now be described in greater detail by reference to the following non-limiting examples.

EXAMPLE 1

The diacrylate ester of dimer-diol (Pripol 2033 from Unichema North America, Chicago, Ill.), i.e.,

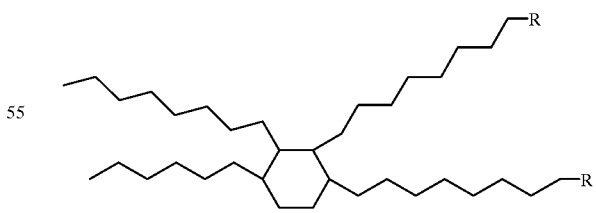

wherein R=H$_2$C=CH—C(O)O—, was prepared by transesterification. The method used was adapted from the general procedure described by C. E. Rehberg in Organic Syntheses Collective Volume III (1955). Thus, a total of 107.6 grams (200 millimoles) of the dimer-diol was weighed into a three-neck 500 ml flask along with 4.0 grams of hydroquinone, 1.0 gram of methanesulfonic acid, and 180 ml (2.0 moles) of methyl acrylate. The flask was fitted with a thermometer, a nitrogen purge tube, and a Vigreaux column surmounted with a solvent recovery condenser. A thermometer was also placed at the distillation head of the condenser, and the vapor duct of the condenser was connected to a collection flask equipped with a bubbler. The contents of the flask were stirred magnetically and sparged with dry nitrogen gas for thirty minutes prior to the application of heat. The flask was then slowly heated in an oil bath until the refluxing solvents reached the condenser head. The methanol generated by the transesterification reaction was slowly removed as an azeotrope with methyl acrylate. The distillation head temperature was maintained between 62° to 75° C. during this process. The oil bath temperature was maintained at approximately 95° C. and the pot temperature was maintained at about 85° C. The reaction appeared to be complete after seven hours of distillation.

The product remaining in the pot was dissolved into 200 ml of heptane and then washed three times with 75 ml of five percent NaOH, followed by treatment with twenty grams of activated charcoal. The residual heptane was removed on a rotary evaporator following filtration through a 0.45 micron filter. The last traces of solvent were removed by sparging the residue under vacuum at 85° C. under a stream of nitrogen. The final product was a light yellow, low viscosity liquid. The product weighed 78.8 grams (61% of theory). Dynamic (10° C./min) thermogravimetric analysis revealed only a 1.03% weight loss by 300° C. for the uncatalyzed monomer. The most intense absorptions in the FTIR spectrum for the final product were at 2919, 2855, 1727, 1407, 1270, 1186, 984, and 810 $cm^{-1}$. No evidence of the starting diol was found in the spectrum.

An aliquot of this material was catalyzed with two percent by weight of dicumyl peroxide. The cure of this catalyzed monomer was evaluated using a differential scanning calorimeter (DSC). The DSC trace revealed an onset temperature of 147.4° C., and a cure maximum of 156.9° C., respectively. The energy of cure was 215 joules per gram.

EXAMPLE 2

The diacrylate ester of "dicyclopentadiene dimethanol" was prepared via transesterification. Thus, approximately 78.4 grams (400 mmoles) of 4,8-bis(hydroxy-methyl) tricyclo[$5.2.1.0^{2,6}$]decane was placed in a three-neck 500 ml round bottom flask along with 4.0 grams of hydroquinone, 1.0 gram of methanesulfonic acid, and 360 ml (4.0 moles) of methyl acrylate. The same oil bath and glassware set-up was used as described in Example 1. The flask was purged with dry nitrogen. The diol in this case was very viscous, so magnetic stirring was begun only after the pot temperature approached 70° C. The methanol/methyl acrylate azeotrope was slowly removed as described previously. The pot was sampled after seven hours of reflux, and it was determined by FTIR that there was still some residual alcohol present. Another 100 ml aliquot of methyl acrylate was added and distillation was commenced again. It was noted that the pot mixture had polymerized to a lightly cross-linked gel after another two hours of heating. The reaction was terminated and the excess methyl acrylate was removed using a rotary evaporator.

The gelled residue was extracted with three successive 200 ml portions of pentane. The pentane extracts were decolorized with twenty grams of activated charcoal. The resulting solution was then filtered through a 0.45 micron filter. The pentane was removed on a rotary evaporator at atmospheric pressure. The product was then sparged at 85° C. under nitrogen. The recovered product yield was 64% of theory. The most intense absorptions in the FTIR spectrum were 2947, 1722, 1407, 1269, 1182, 1053, 961, and 807 $cm^{-1}$. The product appeared to be free of the starting diol according to the FTIR spectrum. The product was a faint yellow, low viscosity, liquid. Thermogravimetric analysis of the uncatalyzed monomer revealed that no volatile components were present up to 200° C. The monomer itself lost twenty-seven percent of its initial weight between 200 and 260° C. The auto cured residue had no further weight loss until the onset of decomposition for the resulting polymer at 415° C.

A DSC of this monomer, catalyzed with two percent by weight of dicumyl peroxide had an onset of cure at 152° C. and a cure maximum at 162° C. The energy of cure was found to be 397 joules per gram.

EXAMPLE 3

The following reagents were added to a three neck, 2-liter round bottom flask fitted with a mechanical stirrer, distillation column (300 mm long and 15 mm diameter, filled with Rashig rings), reflux ratio distillation head and receiver, and positive inert gas fitting:

- 1000 ml of methyl acrylate,
- 250 g 4,8-bis(hydroxymethyl)tricyclo[5.2.1.0]decane (also known as dicyclopentadiene dimethanol, or DCPD), and
- 2 g of 2,2,6,6-tetramethyl-1-piperidinyloxy, free radical (TEMPO).

Following dissolution of the DCPD, the pot temperature was increased to the boiling point of the methyl acrylate, and the low boiling methyl acrylate-water azeotrope removed under partial reflux. The reflux ratio was controlled at approximately 5:1. After aproximately 50 ml of distillate had been collected, the head temperature rose to 79–80° C. (the boiling point of methyl acrylate), indicating substantially complete removal of water.

Under a nitrogen atmosphere, 6 ml of titanium tetraisopropoxide was added. Reflux was reinitiated and allowed to continue over the next two hours under total reflux. Over this two hour period, the head temperature dropped from 79–80° C. to about 60–62° C. (the distillate boiling at 60–62° C. is the methyl acrylate-methanol azeotrope). Next, the reflux ratio was adjusted to approximately 5:1 and maintained until the head temperature rose to approximately 75° C. At this point, the reflux was changed back to total reflux and allowed to continue an additional three hours. The last fraction of azeotrope was removed at an approximate 10:1 reflux ratio over the next three hours.

Upon cooling to room temperature, the reaction mixture was transferred to a 1-liter round bottom flask and the methyl acrylate removed via rotary evaporator at 50° C. under reduced and full water aspirator pressures. The residue was diluted with 1 liter of pentane and transferred to a 2-liter separatory funnel. The organic phase was washed with three-200 ml portions of dilute aqueous HCl, followed by two washes with distilled water. The organic phase was then dried over magnesium sulfate and transferred to a 1-liter Erlenmeyer flask. Approximately 5 g of activated charcoal was added to the organic phase, and the solution then allowed to stir overnight. The next day, the solution was filtered and an additional 5 g of activated charcoal added. The charcoal was removed by filtration after approximately two hours. The pentane was then removed by rotary evaporation at 40° C. first under partial water pressure (~30 mm Hg), then under full mechanical reduced pressure (<0.5 mm Hg). The final product was a light yellow, low viscosity liquid, obtained in about 98% yield.

This example demonstrates that the use of TEMPO facilitates nearly quantitative conversion of DCPD to the acrylate derivative thereof.

EXAMPLE 4

The divinylbenzyl ether of dicylclopentadiene dimethanol was prepared according to the method described by Johnstone in *Tetrahedron* 35:2169 (1979). Approximately 20.1 grams (102 mmoles) of 4,8-bis(hydroxymethyl)tricyclo[5.2.1.0$^{2,6}$]decane was added to a 500 ml Erylenmeyer flask, along with 200 grams of dry dimethylsulfoxide. Twenty-seven grams (about 400 mmoles) of freshly powdered 85% potassium hydroxide was added. The exterior of the flask was cooled in an ice bath and forty grams (260 mmoles) of vinyl benzyl chloride was added dropwise over a forty-five minute period to the magnetically stirred slurry of KOH and diol in DMSO. The solution became a dark brown during the addition of the vinyl benzyl chloride, but faded to a pale amber upon continued stirring. The reaction mixture was allowed to stir for another hour at room temperature.

One-hundred milliliters of toluene was added and the resulting solution was extracted four times with 50 ml portions of deionized water (note some emulsification occurred but this resolved on standing). The toluene phase was then dried by stirring it with 25 gm of magnesium sulfate for approximately two hours. The suspension was filtered and the solid was rinsed with additional toluene. The filtrate and washings were evaporated and then sparged under a stream of nitrogen gas at 95° C. The residue was extracted with 250 ml of pentane. This solution was decolorized using two grams of activated carbon and then filtered. The final product was recovered by evaporation of the pentane. The resulting monomer was a light yellow, low viscosity liquid. The product weighed 42.1 grams (96 percent of theory). The FTIR spectrum of this compound showed significant absorptions at 2945, 1630, 1085, 988, 904, 826, 795, and 712 cm$^{-1}$. Thermogravimetric analysis of the uncatalyzed monomer showed less than one percent weight loss by 300° C. (ramp rate at 10° C./min, nitrogen purge). The onset for decomposition by TGA was 346° C.

The monomer was catalyzed by the addition of two percent by weight of dicumyl peroxide. This mixture had a cure onset of 137° C. and a cure maximum of 148° C. The cure energy was 286 joules per gram.

EXAMPLE 5

The divinyl ester of a dimer diacid having the structure:

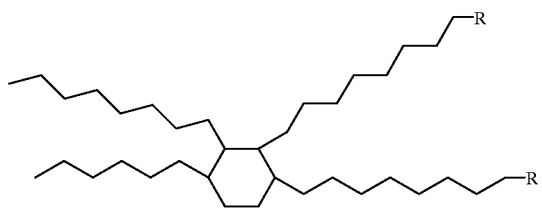

was prepared via transvinylation. Approximately, 28.3 grams (50 mmoles) of the dimer diacid (Pripol 1009 from Unichema) was placed into a single neck round bottom flask along with 0.5 grams of palladium acetate phenanthroline complex and 172.2 grams (2.0 moles) of vinyl acetate. The solution was placed under a nitrogen atmosphere and then stirred magnetically at room temperature for 62 hours. An FTIR spectrum on the product revealed that a small absorption for the acid (@ 1708 cm$^{-1}$) remained. The excess vinyl acetate, along with acetic acid (co-product) was then removed and an additional 43 gram (0.5 mole) aliquot of fresh vinyl acetate was added to the residue. Stirring was continued at room temperature under nitrogen for another forty-eight hours. The excess vinyl ester was then removed and the residue was re-suspended in 100 ml of heptane.

The solution was filtered to remove suspended catalyst residue and then stirred with ten grams of silica gel for fifteen minutes to effect decolorization. The silica gel was then filtered off and then rinsed with additional heptane. The residue was concentrated on a rotary evaporator and finally sparged with nitrogen at 85° C. The product weighed 27.5 grams (89% of theory) and was a colorless, low viscosity liquid. The most intense absorptions in the FTIR spectrum were at 2926, 2854, 1757, 1647, 1142, 949, and 868 wave numbers. Thermogravimetric analysis (10° C./min.) revealed that the uncatalyzed monomer had a 1.3% weight loss by 300° C. and an onset for decomposition at 429° C.

The monomer was catalyzed by the addition of two percent dicumyl peroxide. A DSC on this mixture revealed a cure onset temperature of 145° C., and a cure maximum at 167° C. The energy of cure was found to be 289 joules per gram.

EXAMPLE 6

Mixtures of high $T_g$ and low $T_g$ radical cure monomers were formulated and tested for tensile adhesion to copper. Each of the test mixtures also contained, in addition to a free radical initiator, R130-MA20 (a maleinized polybutadiene product from Ricon Resins, Inc., Grand Junction, Colo.). The test mixtures were formulated as outlined in Table 1.

TABLE 1

Tensile Adhesion Test Compositions

| | - - Formulation - - | | |
|---|---|---|---|
| Component | 6a | 6b | 6c |
| R130-MA20 | 12% | 12% | 12% |
| As prepared in Example 1 | 65% | 43% | 21% |
| As prepared in Example 2 | 21% | 43% | 65% |
| dicumyl peroxide | 2% | 2% | 2% |

Aluminum studs (with a head diameter of 290 mils) were attached to clean copper slugs (1000×400×150 mils) using formulations 6a, 6b and 6c, as set forth above. Seven of these test assemblies were constructed for each of the mixtures. The adhesives were processed by heating the test parts in an air circulating oven set at 200° C. for fifteen minutes. The parts were allowed to cool to room temperature and the adhesive strength was determined using a Sebastian III tensile tester. The results of this test are summarized in Table 2.

TABLE 2

Tensile Adhesion Test Results

| | Stud Pull Value (pounds force) | | |
|---|---|---|---|
| Part | Formulation 6a | Formulation 6b | Formulation 6c |
| 1 | 82 | 71 | 78 |
| 2 | 86 | 105 | 73 |

TABLE 2-continued

Tensile Adhesion Test Results

Stud Pull Value (pounds force)

| Part | Formulation 6a | Formulation 6b | Formulation 6c |
|---|---|---|---|
| 3 | 96 | 78 | 94 |
| 4 | 83 | 68 | 78 |
| 5 | 108 | 82 | 83 |
| 6 | 109 | 78 | 105 |
| 7 | 34 | 94 | 94 |
| Average | 85.4 | 82.3 | 86.4 |
| $F_{n-1}$ | 25.3 | 13.0 | 11.5 |

All of the test compositions employed herein had approximately the same average adhesion. Based on the area of contact between the aluminum stud and copper slug, the average adhesive strength ranged from 1,245 to 1,309 psi. This result suggested that there was a broad viable range over which the combination of high and low $T_g$ monomers can be mixed to form thermoset adhesives.

EXAMPLE 7

Additional compositions were prepared to further investigate the performance of combinations of high and low $T_g$ monomers in tensile adhesion. A wider range (including the upper and lower, single component, extremes) of compositions was used in this experiment. The maleinized polybutadiene component was not used in this series. The ingredients used in making these test mixtures can be found in Table 3.

TABLE 3

Additional Tensile Adhesion Test Compositions

| | Formulation | | | | |
|---|---|---|---|---|---|
| Component | 7a | 7b | 7c | 7d | 7e |
| As prepared in Example 1 | 98% | 73% | 48% | 25% | — |
| As prepared in Example 2 | — | 25% | 49% | 73% | 98% |
| dicumyl peroxide | 2% | 2% | 2% | 2% | 2% |

All of the compositions were tested according to the same method described in Example 6. The results of the tensile tests performed on these mixtures can be found in Table 4.

TABLE 4

Additional Tensile Adhesion Test Results

Stud pull value (pounds force)

| Part | 7a | 7b | 7c | 7d | 7e |
|---|---|---|---|---|---|
| 1 | 0 | 27 | 21 | 33 | 35 |
| 2 | 2 | 15 | 43 | 43 | 33 |
| 3 | 0 | 29 | 47 | 30 | 41 |
| 4 | 1 | 30 | 38 | 54 | 31 |
| 5 | 3 | 27 | 40 | 39 | 41 |
| 6 | 1 | 17 | 43 | 25 | 24 |
| 7 | 22 | 32 | 35 | 36 | 21 |
| Average | 4.1 | 25.3 | 38.1 | 37.1 | 32.3 |
| $F_{n-1}$ | 7.9 | 6.6 | 8.5 | 9.5 | 7.7 |

The results of this test indicated that the presence of at least some of the higher $T_g$ monomer was highly beneficial for the development of an adequate adhesive bond. The absence of the maleinized polybutadiene additive (as had been used in the previous example) in this test series appeared to reduce the tensile adhesion. This result is not surprising in view of the known adhesion promoting properties that acid or acid precursor residues have for bonding to metal surfaces.

EXAMPLE 8

Further tests were performed to explore compositions with low levels of the high $T_g$ monomer. The new ratios used for this test are shown in Table 5.

TABLE 5

Additional Tensile Adhesion Test Compositions

| | Formulation | | | |
|---|---|---|---|---|
| Component | 8a | 8b | 8c | 8d |
| R130-MA20 | 10% | 10% | 5% | 20% |
| As prepared in Example 1 | 78% | 68% | 73% | 73% |
| As prepared in Example 2 | 10% | 20% | 20% | 5% |
| dicumyl peroxide | 2% | 2% | 2% | 2% |

The same method that was described in Example 6 were used to evaluate these mixtures. The results of this new series of tensile tests is shown in Table 6.

TABLE 6

Additional Tensile Adhesion Test Results

Stud pull value (pounds force)

| Part | 8a | 8b | 8c | 8d |
|---|---|---|---|---|
| 1 | 44 | 70 | 51 | 38 |
| 2 | 22 | 61 | 46 | 54 |
| 3 | 46 | 73 | 70 | 80 |
| 4 | 43 | 89 | 68 | 46 |
| 5 | 67 | 59 | 79 | 47 |
| 6 | 48 | 73 | 93 | 72 |
| 7 | 84 | 86 | 63 | 46 |
| Average | 51 | 73 | 67 | 55 |
| $F_{n-1}$ | 20 | 11 | 16 | 15 |

The results from this test series again suggest that there is a broad range of compositions possible that will provide adequate adhesion. The results for "8c", for example, indicate that very little of the maleinized polybutadiene (5% of the total) is required for excellent tensile adhesion to copper.

EXAMPLE 9

A composition ("9a") was formulated that was identical to that of "8b" except that the monomer prepared as described in Example 5, i.e.,

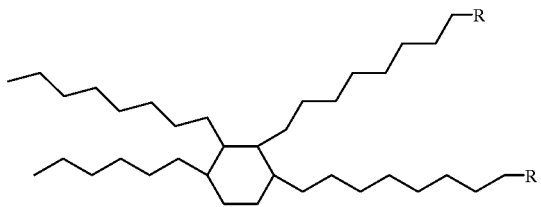

wherein R=H$_2$C=CH—O—C(O)— was substituted for the monomer prepared as described in Example 1, i.e., a compound having the same backbone, but differing only in that R=H$_2$C=CH—C(O)O—. This composition was tested according to the same method outlined in Example 6. The "8b" mixture was used as a "control" for this new formulation. The results of tests with this formulation are summarized in Table 7.

TABLE 7

Additional Tensile Adhesion Test Results

| Part | Stud pull value (pounds force) | |
|---|---|---|
| | 8b | 9a |
| 1 | 93 | 35 |
| 2 | 86 | 36 |
| 3 | 55 | 40 |
| 4 | 39 | 47 |
| 5 | 71 | 37 |
| 6 | 58 | 24 |
| 7 | 59 | 36 |
| Average | 66 | 36 |
| $F_{n-1}$ | 19 | 7 |

The tensile adhesion for the composition ("9a"), in which the dimer diacid divinyl ester is substituted for the dimer diol diacrylate, demonstrates lower adhesion in this test. The adhesion result, nevertheless was adequate for this formulation and, moreover, was very consistent.

EXAMPLE 10

A composition ("10a") was formulated that was identical to that of "8b" except that the monomer prepared as described in Example 4 (i.e., the divinylbenzyl ether of dicylclopentadiene dimethanol) was used as the monomer. This composition was tested according to the same method outlined in Example 6. The "8b" mixture was used as a "control" for this new formulation. The results of tests with this formulation are summarized in Table 8.

TABLE 8

Additional Tensile Adhesion Test Results

| Part | Stud pull value (pounds force) | |
|---|---|---|
| | 8b | 10a |
| 1 | 52 | 35 |
| 2 | 50 | 42 |
| 3 | 76 | 40 |
| 4 | 49 | 26 |
| 5 | 51 | 37 |
| 6 | 61 | 44 |
| 7 | 79 | 48 |
| Average | 60 | 39 |
| $F_{n-1}$ | 13 | 7 |

The tensile adhesion for the composition ("10a"), in which the divinylbenzyl ether of dicylclopentadiene dimethanol is substituted for dicylclopentadiene dimethanol diacrylate, demonstrates lower adhesion in this test. The adhesion result, nevertheless was adequate for this formulation and, moreover, was very consistent.

EXAMPLE 11

Several die attach pastes were prepared using some of the vinyl monomers of the invention, These compositions were patterned after a commercially available thermoset die attach paste, designated QMI 505 (available from Quantum Materials, Inc., San Diego, Calif.). The QMI 505 thermoset contains bismaleimide and vinyl ether monomers. The monomers in the commercial adhesive were replaced by various ratios of select vinyl monomers described in the preceding examples. All other ingredients and ratios used in the QMI 505 formulation were preserved in the test formulations.

Test pastes were thoroughly mixed and degassed. An aliquot of each paste was then placed on the bonding pad of a copper lead frame. A 14 mil thick 150 mil$^2$ silicon die was then placed onto the adhesive and set to a one mil bondline with a micrometer. The assembly was then cured at 200° C. for 1 minute. Eighteen test parts were assembled for each of the compositions. An additional three parts each for all of the compositions were prepared using 300 mil$^2$, 14 mil thich silicon die. These parts were cured in the same manner and used to determine the radius of curvature for each of the adhesives. All die shear measurements were performed using an Anza Technology machine (model 560, Los Altos, Calif.). All hot die shear measurements were performed at a temperature of 245° C. The radius of curvature was measured using a Dektak (Dektak[3] ST, Sloan Technology, Santa Barbara, Calif.) surface profiler instrument. The constituents and performance of each of the test samples, as well as a QMI 505 control, are summarized in Table 9.

TABLE 9

Comparative Results for Silver-Loaded Thermoset Compositions

| Component[a] | 11a | 11b | 11c | 11d | 11e | 11f | 11g | 505 Control |
|---|---|---|---|---|---|---|---|---|
| | | | | Test Compositions | | | | |
| BMI | — | — | — | — | — | — | — | 13.75 |
| DVOT | — | — | — | — | — | — | — | 5.00 |
| Ricon | 2.17 | 2.17 | 2.17 | 2.17 | 2.17 | 2.17 | 2.17 | 3.00 |
| Example 5 | 13.05 | — | — | 16.31 | — | 14.58 | — | — |
| Example 1 | — | 13.05 | 15.23 | — | 16.31 | — | 17.84 | — |
| Example 2 | 6.53 | 6.53 | 4.35 | 5.00 | 3.27 | 5.00 | 1.74 | — |
| MAP | 0.25 | 0.25 | 0.25 | 0.25 | 0.25 | 0.25 | 0.25 | 0.25 |
| EET | 0.76 | 0.76 | 0.76 | 0.76 | 0.76 | 0.76 | 0.76 | 0.76 |
| USP-90MD | 0.24 | 0.24 | 0.24 | 0.24 | 0.24 | 0.24 | 0.24 | 0.24 |
| SSF-70 | 19.25 | 19.25 | 19.25 | 19.25 | 19.25 | 19.25 | 19.25 | 19.25 |
| EA-0030 | 57.75 | 57.75 | 57.75 | 57.75 | 57.75 | 57.75 | 57.75 | 57.75 |
| | | | | Results | | | | |
| Cold shear[b] (kg) (Standard Deviation) | 22.34 (3.17) | 27.82 (5.66) | 21.72 (5.02) | 4.45 (0.76) | 25.63 (3.11) | 7.30 (1.10) | 18.18 (4.84) | 18.61 (3.58) |
| Hot shear (kg) (Standard Deviation) | 5.70 (1.29) | 7.15 (1.97) | 4.53 (1.67) | 1.45 (0.95) | 5.23 (1.52) | 3.19 (1.00) | 6.03 (2.14) | 6.86 (1.55) |
| Radius of curvature (meters) | 0.42 | 0.33 | 0.49 | 2.89 | 0.49 | 1.90 | 0.55 | 0.77 |

[a]BMI is the bismaleimide of dimer-diamine (i.e., the bismaleimide derivative of 10,11-dioctyl-1,20-eicosane)
DVOT is 2-decyl-1-vinyloxytetradecane
Ricon is Ricon-130MA-13 (available from Ricon Resins, Inc., Grand Junction, CO)
MAP is γ-methacryloxypropyltrimethoxysilane (available from OSi Specialties, Inc., Endicott, NY)
EET is β-(3,4-epoxychlohexyl)ethyltrimethoxysilane (available from OSi Specialties, Inc., Endicott, NY)
USP-90MD is a peroxide initiator, 1,1-bis(t-amyl peroxy)cyclohexane (available from Witco Corporation, Marshall, TX)
SF-70 is a silver flake material (available from Degussa Corporation, South Plainfield, NJ)
EA-0030 is a silver flake material (available from Chemet Corporation, Attleboro, MA).
[b]Cold shear is measured at room temperature
Hot shear is measured at 245° C.

While none of samples 11a–11g were optimized for the best combination of room temperature shear, hot die shear values, and radius of curvature values, the performance of the compositions tested here suggests that performance equal to, or better than control can readily be attained using appropriate combinations of vinyl monomers described herein.

EXAMPLE 12

Resin only (i.e., every component except the silver filler materials) mixtures were prepared according to the formulations described above for Test Compositions 11a, 11b, 11c and the QMI 505 Control. The resin-only formulations are referred to hereinafter as 11a', 11b', 11c' and QMI 505' Control. These liquid compositions were then degassed and cast into equal sized pellets weighing approximately 0.5 grams each. three void-free pellets were prepared from each of the mixtures. All of the pellets were then weighed to the nearest milligram to establish their initial weight. The cured resin samples were then placed in a pressure cooker (@ 15 psig, 121°C.) The samples were removed after 75 hours, the superficial moisture removed and the samples were again weighed. A third round of weighing was done after one week (168 hours) in the pressure cooker. The results of this pressure cooker study are presented in Table 10.

TABLE 10

| | Resin Mixture | | | |
|---|---|---|---|---|
| | 11a | 11b | 11c | 505 Control |
| % Wt change @ 75 hrs | −1.60 | 0.51 | 0.58 | 0.56 |
| % Wt change @ 168 hrs | −1.52 | 0.25 | 0.45 | 0.35 |

The results from this study indicate that formulations 11b' and 11c' have about the same moisture uptake capacity as the control. Both of these formulations, therefore, would be just as hydrophobic as the 505-based adhesive, which is, itself, a commercial die attach adhesive noted for its superior moisture resistance. The downward shift in moisture uptake for 11b', 11c' and 505' control formulations between 75 and 168 hours of exposure to steam may arise from hydrolysis of some of the silane coupling agents. The exceptional weight loss seen for the 11a' formulation suggests that either some extraction or hydrolysis event occurred initially. The virtual absence of change between 75 and 168 hours for the 11a' formulation suggests that whatever the process is that is responsible for the initial weight loss, it nevertheless rapidly attains equilibrium.

EXAMPLE 13

Two additional die attach compositions were prepared using a combination of high and low $T_g$ hydrophobic acrylate monomers. The compositions were again tested by attaching 150 mil², 14 mil thick silicon dice to copper lead frames using a 1 mil bondline and a 1 minute, 200° C. cure (as also described in Example 11). Parts were also assembled and cured in a similar manner using Ablestik 83-90 snap cure adhesive (a product of Ablestik Electronic Materials & Adhesives, Rancho Dominguez, Calif.). Room temperature, as well as hot (i.e., 245° C.) die shear measurements were performed on twelve parts for each leg of the test for the test compositions and the control paste. The die shear adhesion for all of these materials was also measured after exposure to steam for 24 hours (@ 15 psig and 121° C.). Information concerning the components and the performance properties of the two test compositions and the control composition (Ablestik 83-90) are presented in Table 11.

TABLE 11

Additional Comparative Results for Silver-Loaded Thermoset Compositions

| Component[a] | 13a | 13b | Ablestik 83-90 Control |
|---|---|---|---|
| | Test Compositions | | |
| Example 1 | 12.05 | 13.19 | — |
| Example 2 | 2.42 | 1.29 | — |
| Ricon-130MA-13 | 1.60 | 1.60 | — |
| MAP | 0.19 | 0.19 | — |
| EET | 0.56 | 0.56 | — |
| USP-90MD | 0.18 | 0.18 | — |
| SF-80LV | 41.5 | 41.5 | — |
| AA0006 | 41.5 | 41.5 | — |
| | Results | | |
| Cold shear[b] (kg) | 18.95 | 17.53 | 26.13 |
| (Standard Deviation) | (3.56) | (3.06) | (7.83) |
| Hot shear (kg) | 5.25 | 5.86 | 3.47 |
| (Standard Deviation) | (1.40) | (1.45) | (0.75) |
| Radius of curvature (meters) | 0.52 | 0.51 | 0.40 |

[a]Ricon is Ricon-13OMA-13 (available from Ricon Resins, Inc., Grand Junction, CO)
MAP is (-methacryloxypropyltrimethoxysilane (available from OSi Specialties, Inc., Endicott, NY)
EET is $-(3,4-epoxycyclohexyl)ethyl trimethoxysilane (available from OSi Specialties, Inc., Endicott, NY)
USP-90MD is a peroxide initiator, 1,1-bis(t-amyl peroxy)cyclohexane (available from Witco Corporation, Marshall, TX)
SF-80LV is a silver flake material (available from Degussa Corporation, South Plainfield, NJ)
AA0006 is a silver flake material (available from Chemet Corporation, Attleboro, MA).

Both the 13a and 13b compositions had lower initial room temperature shear values than did the commercially available control adhesive, Ablestik 83-90. The test compositions, however, were superior in adhesion compared to control under hot die shear conditions and after 24 hours exposure under pressure cooker conditions. It is also worth noting that the 13a adhesive was found to have an average die shear value of 28.89 (with a standard deviation of 1.71 kg) after 24 hours of conditioning in the pressure cooker (13a was the only die attach paste subjected to these extended test conditions). The test pastes also have higher radii of curvature than the control Ablestik adhesive, and hence are less prone to the effects of stress than are prior art adhesives.

While the invention has been described in detail with reference to certain preferred embodiments thereof, it will be understood that modifications and variations are within the spirit and scope of that which is described and claimed.

That which is claimed is:

1. A die-attach paste comprising:
   in the range of about 10 up to about 80 wt % of a thermosetting resin composition, and
   in the range of about 20 up to about 90 wt % of a conductive filler,
   wherein said thermosetting resin composition comprises:
   (a) at least two polyvinyl compounds of structure I as follows:

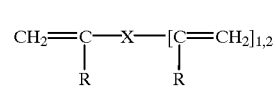

wherein X is a hydrophobic bridging group having in the range of about 7 up to about 400 carbon atoms, and R is H or methyl,
   wherein a homopolymer formed from at least one compound of structure I has a $T_g \geq$ about 100° C.; wherein at least one such compound of structure I is selected from the group consisting of 4,8-bis (acryloxymethyl)-tricyclo[5.2.1.0$^{2,6}$]decane, the diacrylate of perhydro bisphenol A, 4,8-bis (paravinylphenol)-tricyclo[5.2.1.0$^{2,6}$]decane, 4,8-bis(paravinyl hydroxymethyl benzene)-tricyclo [5.2.1.0$^{2,6}$]decane, 4,8-divinyl ester of tricyclo [5.2.1.0$^{2,6}$]decane, and a compound of the following structure:

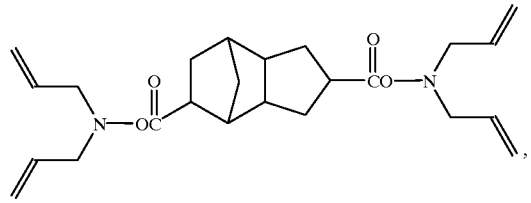

wherein a homopolymer formed from at least one compound of structure I has a $T_g \leq$ about 0° C., and
   wherein the ratio of said polyvinyl compounds of structure I is sufficient to provide a desirable balance of high and low temperature die shear strength, flexibility and toughness;
   (b) optionally, up to about 75 wt % of a monovinyl counterpart of a compound of structure I, having the structure II as follows:

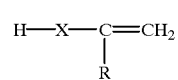

wherein R and X are as defined above;
   (c) in the range of about 0.1 up to about 3 wt % of at least one free radical initiator, based on the total weight of the composition;
   (d) optionally, up to about 60 wt % of at least one polyunsaturated comonomer other than the polyvinyl compounds of (a), based on the total weight of the composition; and
   (e) optionally, a diluent.

2. A die-attach paste according to claim 1 wherein said thermosetting resin composition further comprises:
   (f) in the range of 0.05 up to 10 wt % of at least one coupling agent, based on the total weight of the composition.

3. A die-attach paste according to claim 2 wherein the coupling agent is selected from silicate esters, metal acrylate salts, titanates or compounds containing a co-polymerizable group and a chelating ligand.

4. A die-attach paste according to claim 1 wherein said thermosetting resin composition has a viscosity of from about 10 to about 12,000 centipoise.

5. A die-attach paste according to claim 1 wherein said thermosetting resin composition has a viscosity of from about 70 to about 2,000 centipoise.

6. A die-attach paste according to claim 1 wherein the free radical initiator is selected from peroxides or azo compounds.

7. A die-attach paste according to claim 1 wherein the diluent is selected from dimethylformamide, dimethylacetamide, N-methylpyrrolidone, toluene, xylene, methylene chloride, tetrahydrofuran, glycol ethers, methyl ethyl ketone or monoalkyl or dialkyl ethers of ethylene glycol, polyethylene glycol, propylene glycol or polypropylene glycol.

8. A die-attach paste according to claim 1 wherein the conductive filler is electrically conductive.

9. A die-attach paste according to claim 1 wherein said conductive filler is thermally conductive.

10. An assembly comprising a microelectronic device permanently adhered to a substrate by a cured aliquot of the die attach paste according to claim 1.

11. A method for adhesively attaching a first article to a second article, said method comprising:
   (a) applying die attach paste according to claim 1 to said first article,
   (b) bringing said first and second article into intimate contact to form an assembly wherein said first article and said second article are separated only by the adhesive composition applied in step (a), and thereafter,
   (c) subjecting said assembly to conditions suitable to cure said adhesive composition.

12. A method for adhesively attaching a microelectronic device to a substrate, said method comprising:
   (a) applying die attach paste according to claim 1 to said substrate and/or said microelectronic device,
   (b) bringing said substrate and said device into intimate contact to form an assembly wherein said substrate and said device are separated only by the die attach composition applied in step (a), and thereafter,
   (c) subjecting said assembly to conditions suitable to cure said die attach composition.

13. A composition useful for protecting a solder interconnection between a semiconductor device and a supporting substrate, said composition comprising:
   in the range of about 20 up to about 80 wt % of a curable thermosetting polyvinyl-based binder system, wherein said binder system has a viscosity at room temperature of no greater than about 2,500 centipoise, and
   in the range of about 20 up to about 80 wt % of a filler having a maximum particle size of about 50 microns,
   wherein wt % is based on the total weight of the composition unless otherwise indicated,
   wherein said binder system comprises:
      (a) at least two polyvinyl compounds of structure I as follows:

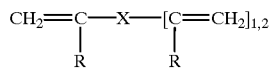

wherein X is a hydrophobic bridging group having in the range of about 7 up to about 400 carbon atoms, and R is H or methyl,
wherein a homopolymer formed from at least one compound of structure I has a $T_g \geq$ about 100° C.; wherein at least one such compound of structure I is selected from the group consisting of 4,8-bis(acryloxymethyl)-tricyclo[$5.2.1.0^{2,6}$]decane, the diacrylate of perhydro bisphenol A, 4,8-bis(paravinylphenol)-tricyclo[$5.2.1.0^{2,6}$]decane, 4,8-bis(paravinyl hydroxymethyl benzene)-tricyclo[$5.2.1.0^{2,6}$]decane, 4,8-divinyl ester of tricyclo[$5.2.1.0^{2,6}$]decane, and a compound of the following structure:

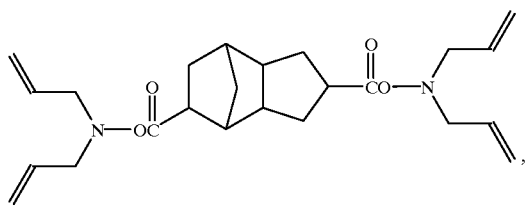

wherein a homopolymer formed from at least one compound of structure I has a $T_g \leq$ about 0° C., and
wherein the ratio of said polyvinyl compounds of structure I is sufficient to provide desirable balance of high and low temperature die shear strength, flexibility and toughness;
   (b) optionally, in the range of about 5 up to about 95 wt % of a monovinyl counterpart of a compound of structure I, having the structure II as follows:

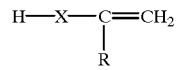

wherein R and X are as defined above;
   (c) in the range of about 0.1 up to about 3 wt % of at least one free radical initiator, based on the total weight of the composition;
   (d) optionally, in the range of about 1.0 up to about 60 wt % of at least one polyunsaturated comonomer, based on the total weight of the composition; and
   (e) optionally, a diluent.

14. A composition according to claim 13 further comprising one or more of a coupling agent, a thixotrope, a dye, an anti-oxidant, a surfactant, an inert diluent, a reactive diluent, a fluxing agent or an anti-bleed agent.

15. A composition according to claim 13 wherein the viscosity of said composition at room temperature falls in the range of about 3,000 up to about 150,000 centipoise.

16. A composition according to claim 13 wherein the viscosity of said composition at a working temperature of up to about 100° C. is no greater than about 3,000 centipoise.

17. A composition according to claim 13 wherein the majority of said filler particles are substantially spherical, and wherein said filler has a low coefficient of thermal expansion, is substantially non-conductive, and has low levels of extractable ions.

18. A composition according to claim 13 wherein said filler has an emission rate of less than about 0.01 alpha particles/cm$^2$-hr.

19. A composition according to claim 13 wherein the particle size of said filler falls in the range of about 0.5 up to about 20 micrometers.

20. A composition according to claim 13 wherein said filler is selected from alumina, aluminum nitride, boron nitride, borosilicate glass, diamond dust, silica, quartz, silicon, silicon carbide, titania or zirconium tungstate, optionally treated with coupling agents and/or lubricants.

21. A method of protecting a solder interconnection between a semiconductor device and a supporting substrate, said method comprising:

attaching said device to said substrate by a plurality of solder connections that extend from the supporting substrate to electrodes on said semiconductor device, thereby forming a gap between said supporting substrate and said semiconductor device, filling said gap with a composition according to claim 13, and subjecting said composition to curing conditions.

22. A method according to claim 21 wherein said substrate is an organic or an inorganic material.

23. A method according to claim 22 wherein said organic substrate is a laminate.

24. A method according to claim 22 wherein said inorganic substrate is a silicon support, a ceramic support, sapphire or porcelain coated on steel.

25. A method according to claim 21 wherein said curing conditions comprise subjecting said composition to a temperature of up to about 170° C. for up to about 2 hours.

26. An article comprising a circuit board having a solder mask deposited thereon, wherein said solder mask is prepared from a composition comprising:

(a) at least two polyvinyl compounds of structure I as follows:

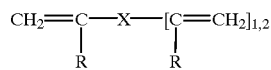

wherein X is a hydrophobic bridging group having in the range of about 7 up to about 400 carbon atoms, and R is H or methyl, wherein a homopolymer formed from at least one compound of structure I has a $T_g \geq$ about 100° C.; wherein at least one such compound of structure I is selected from the group consisting of 4,8-bis (acryloxymethyl)-tricyclo[5.2.1.0$^{2,6}$]decane, the diacrylate of perhydro bisphenol A, 4,8-bis (paravinylphenol)-tricyclo[5.2.1.0$^{2,6}$]decane, 4,8-bis (paravinyl hydroxymethyl benzene)-tricyclo [5.2.1.0$^{2,6}$]decane, 4,8-divinyl ester of tricyclo [5.2.1.0$^{2,6}$]decane, and a compound of the following structure:

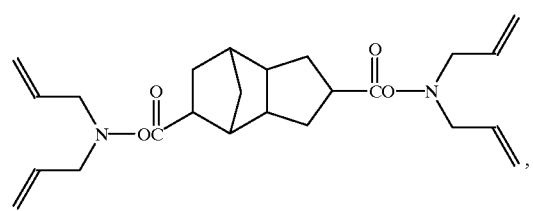

wherein a homopolymer formed from at least one compound of structure I has a $T_g \leq$ about 0° C., and wherein the ratio of said polyvinyl compounds of structure I is sufficient to provide desirable balance of high and low temperature die shear strength, flexibility and toughness;

(b) optionally, in the range of about 5 up to about 75 wt % of a monovinyl counterpart of a compound of structure I, having the structure II as follows:

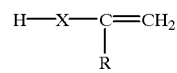

wherein R and X are as defined above;

(c) in the range of about 0.1 up to about 3 wt % of at least one free radical initiator, based on the total weight of the composition;

(d) optionally, in the range of about 1.0 up to about 60 wt % of at least one polyunsaturated comonomer, based on the total weight of the composition; and (e) optionally, a diluent.

27. An article comprising an electronic component encased within an aliquot of composition according to claim 1.

28. A die-attach paste according to claim 1 wherein at least one compound of structure I which forms homopolymer having a $T_g \geq$ about 100° C., is 4,8-bis(acryloxymethyl)-tricyclo[5.2.1.0$^{2,6}$]decane.

29. A die-attach paste according to claim 1 wherein at least one compound of structure I which forms homopolymer having a $T_g \geq$ about 100° C., is the diacrylate of perhydro bisphenol A.

30. A die-attach paste according to claim 1 wherein at least one compound of structure I which forms homopolymer having a $T_g \geq$ about 100° C., is 4,8-bis (paravinylphenol)-tricyclo[5.2.1.0$^{2,6}$]decane.

31. A die-attach paste according to claim 1 wherein said at least one compound of structure I which forms homopolymer having a $T_g \geq$ about 100° C., is 4,8-bis(paravinyl hydroxymethyl benzene)-tricyclo[5.2.1.0$^{2,6}$]decane.

32. A die-attach paste according to claim 1 wherein at least one compound of structure I which forms homopolymer having a $T_g \geq$ about 100° C., is the 4,8-divinyl ester of tricyclo[5.2.1.0$^{2,6}$]decane.

33. A die-attach paste according to claim 1 wherein at least one compound of structure I which forms homopolymer having a $T_g \geq$ about 100° C., has the structure:

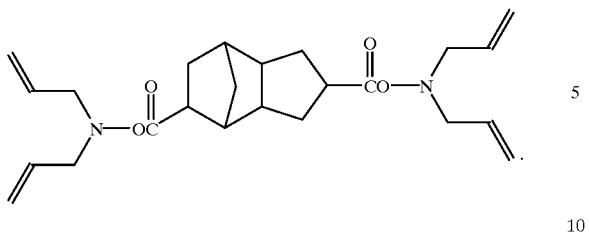

34. A die-attach paste according to claim 1 wherein at least one compound of structure I which forms homopolymer having a $T_g \leq$ about 100° C., is the diacrylate of 10,11-dioctyl-1,20-eicosane.

35. A composition according to claim 13 wherein at least one compound of structure I which forms homopolymer having a $T_g \geq$ about 100° C., is 4,8-bis(acryloxymethyl)-tricyclo[5.2.1.0$^{2,6}$]decane.

36. A composition according to claim 13 wherein at least one compound of structure I which forms homopolymer having a $T_g \geq$ about 100° C., is the diacrylate of perhydro bisphenol A.

37. A composition according to claim 13 wherein at least one compound of structure I which forms homopolymer having a $T_g \geq$ about 100° C., is 4,8-bis(paravinylphenol)-tricyclo[5.2.1.0$^{2,6}$]decane.

38. A composition according to claim 13 wherein at least one compound of structure I which forms homopolymer having a $T_g \geq$ about 100° C., is 4,8-bis(paravinyl hydroxymethyl benzene)-tricyclo[5.2.1.0$^{2,6}$]decane.

39. A composition according to claim 13 wherein at least one compound of structure I which forms homopolymer having a $T_g \geq$ about 100° C., is the 4,8-divinyl ester of tricyclo[5.2.1.0$^{2,6}$]decane.

40. A composition according to claim 13 wherein at least one compound of structure I which forms homopolymer having a $T_g \geq$ about 100° C., has the structure:

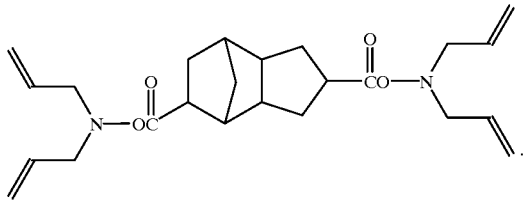

41. A composition according to claim 13 wherein at least one compound of structure I which forms homopolymer having a $T_g \leq$ about 100° C., is the diacrylate of 10,11-dioctyl-1,20-eicosane.

42. A composition useful for protecting a solder interconnection between a semiconductor device and a supporting substrate, said composition comprising:

in the range of about 20 up to about 80 wt % of a curable thermosetting polyvinyl-based binder system, wherein said binder system has a viscosity at room temperature of no greater than about 2,500 centipoise, and in the range of about 20 up to about 80 wt % of a filler having a maximum particle size of about 50 microns, wherein wt % is based on the total weight of the composition unless otherwise indicated, wherein said binder system comprises:
(a) at least two polyvinyl compounds of structure I as follows:

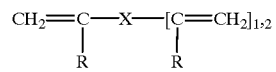

wherein X is a hydrophobic bridging group having in the range of about 7 up to about 400 carbon atoms, and R is H or methyl, wherein a homopolymer formed from at least one compound of structure I has a $T_g \geq$ about 100° C., wherein a homopolymer formed from at least one compound of structure I has a $T_g \leq$ about 0° C., wherein at least one compound of structure I is the diacrylate of 10,11-dioctyl-1,20-eicosane, and wherein the ratio of said polyvinyl compounds of structure I is sufficient to provide desirable balance of high and low temperature die shear strength, flexibility and toughness;

(b) optionally, in the range of about 5 up to, about 95 wt % of a monovinyl counterpart of a compound of structure I, having the structure II as follows:

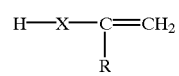

wherein R and X are as defined above;

(c) in the range of about 0.1 up to about 3 wt % of at least one free radical initiator, based on the total weight of the composition;

(d) optionally, in the range of about 1.0 up to about 60 wt % of at least one polyunsaturated comonomer, based on the total weight of the composition; and (e) optionally, a diluent.

43. A composition according to claim 42 further comprising one or more of a coupling agent, a thixotrope, a dye, an anti-oxidant, a surfactant, an inert diluent, a reactive diluent, a fluxing agent or an anti-bleed agent.

44. A composition according to claim 42 wherein the viscosity of said composition at room temperature falls in the range of about 3,000 up to about 150,000 centipoise.

45. A composition according to claim 42 wherein the viscosity of said composition at a working temperature of up to about 100° C. is no greater than about 3,000 centipoise.

46. A composition according to claim 42 wherein the majority of said filler particles are substantially spherical, and wherein said filler has a low coefficient of thermal expansion, is substantially non-conductive, and has low levels of extractable ions.

47. A composition according to claim 42 wherein said filler has an emission rate of less than about 0.01 alpha particles/cm$^2$-hr.

48. A composition according to claim 42 wherein the particle size of said filler falls in the range of about 0.5 up to about 20 micrometers.

49. A composition according to claim 42 wherein said filler is selected from alumina, aluminum nitride, boron nitride, borosilicate glass, diamond dust, silica, quartz, silicon, silicon carbide, titania or zirconium tungstate, optionally treated with coupling agents and/or lubricants.

50. A composition according to claim 42 wherein at least one compound of structure I which forms homopolymer having a $T_g \geq$ about 100° C., is 4,8-bis(acryloxymethyl)-tricyclo[5.2.1.0$^{2,6}$]decane.

51. A composition according to claim 42 wherein at least one compound of structure I which forms homopolymer having a $T_g \geq$ about 100° C., is the diacrylate of perhydro bisphenol A.

52. A composition according to claim 42 wherein at least one compound of structure I which forms homopolymer having a $T_g \geq$ about 100° C., is 4,8-bis(paravinylphenol)-tricyclo[5.2.1.0$^{2,6}$]decane.

53. A composition according to claim 42 wherein at least one compound of structure I which forms homopolymer having a $T_g \geq$ about 100° C., is 4,8-bis(paravinyl hydroxymethyl benzene)-tricyclo[5.2.1.0$^{2,6}$]decane.

54. A composition according to claim 42 wherein at least one compound of structure I which forms homopolymer having a $T_g \geq$ about 100° C., is the 4,8-divinyl ester of tricyclo[5.2.1.0$^{2,6}$]decane.

55. A composition according to claim 42 wherein at least one compound of structure I which forms homopolymer having a $T_g \geq$ about 100° C., has the structure:

[chemical structure]

56. A die-attach paste comprising:
in the range of about 10 up to about 80 wt % of a thermosetting resin composition, and
in the range of about 20 up to about 90 wt % of a conductive filler,
wherein said thermosetting resin composition comprises:
(a) at least two polyvinyl compounds of structure I as follows:

$$CH_2=\underset{R}{C}-X-[\underset{R}{C}=CH_2]_{1,2}$$  I wherein X is a hydrophobic bridging group having in the range of about 7 up to about 400 carbon atoms, and R is H or methyl,
wherein a homopolymer formed from at least one compound of structure I has a $T_g \geq$ about 100° C.,
wherein a homopolymer formed from at least one compound of structure I has a $T_g \leq$ about 0° C.;
wherein at least one such compound of structure I is the diacrylate of 10,11-dioctyl-1,20-eicosane, and
wherein the ratio of said polyvinyl compounds of structure I is sufficient to provide a desirable balance of high and low temperature die shear strength, flexibility and toughness;
(b) optionally, up to about 75 wt % of a monovinyl counterpart of a compound of structure I, having the structure II as follows:

$$H-X-\underset{R}{C}=CH_2$$  II wherein R and X are as defined above;
(c) in the range of about 0.1 up to about 3 wt % of at least one free radical initiator, based on the total weight of the composition;

(d) optionally, up to about 60 wt % of at least one polyunsaturated comonomer other than the polyvinyl compounds of (a), based on the total weight of the composition; and
(e) optionally, a diluent.

57. A die-attach paste according to claim 56 wherein at least one compound of structure I which forms homopolymer having a $T_g \geq$ about 100° C., is 4,8-bis(acryloxymethyl)-tricyclo[5.2.1.0$^{2,6}$]decane.

58. A die-attach paste according to claim 56 wherein at least one compound of structure I which forms homopolymer having a $T_g \geq$ about 100° C., is the diacrylate of perhydro bisphenol A.

59. A die-attach paste according to claim 56 wherein at least one compound of structure I which forms homopolymer having a $T_g \geq$ about 100° C., is 4,8-bis(paravinylphenol)-tricyclo[5.2.1.0$^{2,6}$]decane.

60. A die-attach paste according to claim 56 wherein at least one compound of structure I which forms homopolymer having a $T_g \geq$ about 100° C., is 4,8-bis(paravinyl hydroxymethyl benzene)-tricyclo[5.2.1.0$^{2,6}$]decane.

61. A die-attach paste according to claim 56 wherein at least one compound of structure I which forms homopolymer having a $T_g \geq$ about 100° C., is the 4,8-divinyl ester of tricyclo[5.2.1.0$^{2,6}$]decane.

62. A die-attach paste according to claim 56 wherein at least one compound of structure I which forms homopolymer having a $T_g \geq$ about 100° C., has the structure:

[chemical structure]

63. A die-attach paste according to claim 56 wherein said thermosetting resin composition further comprises:
(f) in the range of 0.05 up to 10 wt % of at least one coupling agent, based on the total weight of the composition.

64. A die-attach paste according to claim 63 wherein the coupling agent is selected from silicate esters, metal acrylate salts, titanates or compounds containing a co-polymerizable group and a chelating ligand.

65. A die-attach paste according to claim 56 wherein said thermosetting resin composition has a viscosity of from about 10 to about 12,000 centipoise.

66. A die-attach paste according to claim 56 wherein said thermosetting resin composition has a viscosity of from about 70 to about 2,000 centipoise.

67. A die-attach paste according to claim 56 wherein the free radical initiator is selected from peroxides or azo compounds.

68. A die-attach paste according to claim 56 wherein the diluent is selected from dimethylformamide, dimethylacetamide, N-methylpyrrolidone, toluene, xylene, methylene chloride, tetrahydrofuran, glycol ethers, methyl ethyl ketone or monoalkyl or dialkyl ethers of ethylene glycol, polyethylene glycol, propylene glycol or polypropylene glycol.

69. A die-attach paste according to claim 56 wherein the conductive filler is electrically conductive.

70. A die-attach paste according to claim 56 wherein said conductive filler is thermally conductive.

71. An assembly comprising a microelectronic device permanently adhered to a substrate by a cured aliquot of the die attach paste according to claim 56.

72. A method for adhesively attaching a first article to a second article, said method comprising:
(a) applying die attach paste according to claim 67 to said first article,
(b) bringing said first and second article into intimate contact to form an assembly wherein said first article and said second article are separated only by the adhesive composition applied in step (a), and thereafter,
(c) subjecting said assembly to conditions suitable to cure said adhesive composition.

73. A method for adhesively attaching a microelectronic device to a substrate, said method comprising:
(a) applying die attach paste according to claim 56 to said substrate and/or said microelectronic device,
(b) bringing said substrate and said device into intimate contact to form an assembly wherein said substrate and said device are separated only by the die attach composition applied in step (a), and thereafter,
(c) subjecting said assembly to conditions suitable to cure said die attach composition.

74. A method of protecting a solder interconnection between a semiconductor device and a supporting substrate, said method comprising:
attaching said device to said substrate by a plurality of solder connections that extend from the supporting substrate to electrodes on said semiconductor device, thereby forming a gap between said supporting substrate and said semiconductor device,
filling said gap with a composition according to claim 56, and
subjecting said composition to curing conditions.

75. A method according to claim 74 wherein said substrate is an organic or an inorganic material.

76. A method according to claim 74 wherein said organic substrate is a laminate.

77. A method according to claim 74 wherein said inorganic substrate is a silicon support, a ceramic support, sapphire or porcelain coated on steel.

78. A method according to claim 74 wherein said curing conditions comprise subjecting said composition to a temperature of up to about 170° C. for up to about 2 hours.

79. An article comprising a circuit board having a solder mask deposited thereon, wherein said solder mask is prepared from a composition comprising:
(a) at least two polyvinyl compounds of structure I as follows:

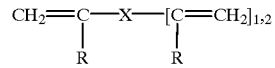

wherein X is a hydrophobic bridging group having in the range of about 7 up to about 400 carbon atoms, and R is H or methyl,
wherein a homopolymer formed from at least one compound of structure I has a $T_g \geq$ about 100° C.,
wherein a homopolymer formed from at least one compound of structure I has a $T_g \leq$ about 0° C.;
wherein at least one such compound of structure I is the diacrylate of 10,11-dioctyl-1,20-eicosane, and
wherein the ratio of said polyvinyl compounds of structure I is sufficient to provide desirable balance of high and low temperature die shear strength, flexibility and toughness;
(b) optionally, in the range of about 5 up to about 75 wt % of a monovinyl counterpart of a compound of structure I, having the structure II as follows:

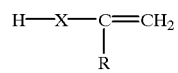

wherein R and X are as defined above;
(c) in the range of about 0.1 up to about 3 wt % of at least one free radical initiator, based on the total weight of the composition;
(d) optionally, in the range of about 1.0 up to about 60 wt % of at least one polyunsaturated comonomer, based on the total weight of the composition; and
(e) optionally, a diluent.

80. An article comprising an electronic component encased within an aliquot of composition according to claim 1.

* * * * *